(12) United States Patent
Strid et al.

(10) Patent No.: US 7,759,953 B2
(45) Date of Patent: *Jul. 20, 2010

(54) ACTIVE WAFER PROBE

(75) Inventors: Eric Strid, Portland, OR (US); K. Reed Gleason, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/228,812

(22) Filed: Aug. 14, 2008

(65) Prior Publication Data

US 2008/0309358 A1    Dec. 18, 2008

Related U.S. Application Data

(63) Continuation of application No. 11/019,440, filed on Dec. 21, 2004, now Pat. No. 7,427,868.

(60) Provisional application No. 60/589,346, filed on Jul. 20, 2004, provisional application No. 60/532,756, filed on Dec. 24, 2003.

(51) Int. Cl.
*G01R 31/02* (2006.01)

(52) U.S. Cl. .................. 324/754; 324/761; 324/762

(58) Field of Classification Search .......... None
See application file for complete search history.

(56) References Cited

U.S. PATENT DOCUMENTS

| | | | |
|---|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1952 | Dodd |
| 2,901,696 A | 8/1959 | Möllfors |
| 2,921,276 A | 1/1960 | Fubini |
| 2,947,939 A | 8/1960 | Harwig |
| 3,111,699 A | 11/1963 | Comeau |
| 3,176,091 A | 3/1965 | Hanson et al. |
| 3,193,712 A | 7/1965 | Harris |
| 3,218,584 A | 11/1965 | Ayer |
| 3,230,299 A | 1/1966 | Radziekowski |

(Continued)

FOREIGN PATENT DOCUMENTS

CH    607 045    11/1978

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Minh N Tang
(74) *Attorney, Agent, or Firm*—Chernoff, Vilhauer, McClung & Stenzel

(57) ABSTRACT

A probe suitable for probing a semiconductor wafer that includes an active circuit. The probe may include a flexible interconnection between the active circuit and a support structure. The probe may impose a relatively low capacitance on the device under test.

5 Claims, 12 Drawing Sheets

U.S. PATENT DOCUMENTS

| | | |
|---|---|---|
| 3,262,593 A | 7/1966 | Hainer |
| 3,396,598 A | 8/1968 | Grispo |
| 3,401,126 A | 9/1968 | Miller et al |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |

| | | | | | |
|---|---|---|---|---|---|
| 4,714,873 A | 12/1987 | McPherson et al. | 4,980,638 A | 12/1990 | Dermon et al. |
| 4,722,846 A | 2/1988 | Reeds | 4,983,910 A | 1/1991 | Majidi-Ahy et al. |
| 4,725,793 A | 2/1988 | Igarashi | 4,987,100 A | 1/1991 | McBride et al. |
| 4,727,319 A | 2/1988 | Shahriary | 4,988,062 A | 1/1991 | London |
| 4,727,391 A | 2/1988 | Tajima et al. | 4,991,290 A | 2/1991 | MacKay |
| 4,727,637 A | 3/1988 | Buckwitz et al. | 4,998,062 A | 3/1991 | Ikeda |
| 4,734,641 A | 3/1988 | Byrd, Jr. et al. | 4,998,063 A | 3/1991 | Miller |
| 4,739,259 A | 4/1988 | Hadwin et al. | 5,001,423 A | 3/1991 | Abrami et al. |
| 4,740,764 A | 4/1988 | Gerlack | 5,003,253 A | 3/1991 | Majidi-Ahy et al. |
| 4,742,571 A | 5/1988 | Letron | 5,007,163 A | 4/1991 | Pope et al. |
| 4,744,041 A | 5/1988 | Strunk et al. | 5,012,186 A | 4/1991 | Gleason |
| 4,746,857 A | 5/1988 | Sakai et al. | 5,020,219 A | 6/1991 | Leedy |
| 4,749,942 A | 6/1988 | Sang et al. | 5,021,186 A | 6/1991 | Ota et al. |
| 4,754,239 A | 6/1988 | Sedivec | 5,030,907 A | 7/1991 | Yih et al. |
| 4,755,742 A | 7/1988 | Mallory et al. | 5,041,782 A | 8/1991 | Marzan |
| 4,755,746 A | 7/1988 | Mallory et al. | 5,045,781 A | 9/1991 | Gleason et al. |
| 4,755,747 A | 7/1988 | Sato | 5,059,898 A | 10/1991 | Barsotti et al. |
| 4,755,872 A | 7/1988 | Esrig et al. | 5,061,192 A | 10/1991 | Chapin et al. |
| 4,755,874 A | 7/1988 | Esrig et al. | 5,061,823 A | 10/1991 | Carroll |
| 4,757,255 A | 7/1988 | Margozzi | 5,062,628 A | 11/1991 | Heyn et al. |
| 4,764,723 A | 8/1988 | Strid | 5,066,357 A | 11/1991 | Smyth, Jr. et al. |
| 4,766,384 A | 8/1988 | Kleinberg et al. | 5,069,628 A | 11/1991 | Crumly |
| 4,772,846 A | 9/1988 | Reeds | 5,082,627 A | 1/1992 | Stanbro |
| 4,780,670 A | 10/1988 | Cherry | 5,084,671 A | 1/1992 | Miyata et al. |
| 4,783,625 A | 11/1988 | Harry et al. | 5,089,774 A | 2/1992 | Nakano |
| 4,788,851 A | 12/1988 | Brault | 5,091,692 A | 2/1992 | Ohno et al. |
| 4,791,363 A | 12/1988 | Logan | 5,091,732 A | 2/1992 | Mileski et al. |
| 4,793,814 A | 12/1988 | Zifcak et al. | 5,095,891 A | 3/1992 | Reitter |
| 4,795,962 A | 1/1989 | Yanagawa et al. | 5,097,101 A | 3/1992 | Trobough |
| 4,805,627 A | 2/1989 | Klingenbeck et al. | 5,097,207 A | 3/1992 | Blanz |
| 4,810,981 A | 3/1989 | Herstein | 5,101,453 A | 3/1992 | Rumbaugh |
| 4,812,754 A | 3/1989 | Tracy et al. | 5,107,076 A | 4/1992 | Bullock et al. |
| 4,818,059 A | 4/1989 | Kakii et al. | 5,116,180 A | 5/1992 | Fung et al. |
| 4,827,211 A | 5/1989 | Strid et al. | 5,126,286 A | 6/1992 | Chance |
| 4,831,494 A | 5/1989 | Arnold et al. | 5,126,696 A | 6/1992 | Grote et al. |
| 4,835,495 A | 5/1989 | Simonutti | 5,128,612 A | 7/1992 | Aton et al. |
| 4,837,507 A | 6/1989 | Hechtman | 5,129,006 A | 7/1992 | Hill et al. |
| 4,839,587 A | 6/1989 | Flatley et al. | 5,133,119 A | 7/1992 | Afshari et al. |
| 4,849,689 A | 7/1989 | Gleason et al. | 5,134,365 A | 7/1992 | Okubo et al. |
| 4,851,767 A | 7/1989 | Halbout et al. | 5,136,237 A | 8/1992 | Smith et al. |
| 4,853,624 A | 8/1989 | Rabjohn | 5,138,289 A | 8/1992 | McGrath |
| 4,853,627 A | 8/1989 | Gleason et al. | 5,142,224 A | 8/1992 | Smith et al. |
| 4,858,160 A | 8/1989 | Strid et al. | 5,145,552 A | 9/1992 | Yoshizawa et al. |
| 4,859,989 A | 8/1989 | McPherson | 5,148,131 A | 9/1992 | Amboss et al. |
| 4,864,227 A | 9/1989 | Sato | 5,159,264 A | 10/1992 | Anderson |
| 4,871,883 A | 10/1989 | Guiol | 5,159,267 A | 10/1992 | Anderson |
| 4,871,964 A | 10/1989 | Boll et al. | 5,159,752 A | 11/1992 | Mahant-Shetti et al. |
| 4,888,550 A | 12/1989 | Reid | 5,160,883 A | 11/1992 | Blanz |
| 4,891,584 A | 1/1990 | Kamieniecki et al. | 5,164,319 A | 11/1992 | Hafeman et al. |
| 4,893,914 A | 1/1990 | Hancock et al. | 5,166,606 A | 11/1992 | Blanz |
| 4,894,612 A | 1/1990 | Drake et al. | 5,170,930 A | 12/1992 | Dolbear et al. |
| 4,899,126 A | 2/1990 | Yamada | 5,172,049 A | 12/1992 | Kiyokawa et al. |
| 4,899,998 A | 2/1990 | Feramachi | 5,172,050 A | 12/1992 | Swapp |
| 4,901,012 A | 2/1990 | Gloanec et al. | 5,172,051 A | 12/1992 | Zamborelli |
| 4,904,933 A | 2/1990 | Snyder et al. | 5,177,438 A | 1/1993 | Littlebury et al. |
| 4,904,935 A | 2/1990 | Calma et al. | 5,180,977 A | 1/1993 | Huff |
| 4,906,920 A | 3/1990 | Huff et al. | 5,187,443 A | 2/1993 | Bereskin |
| 4,908,570 A | 3/1990 | Gupta et al. | 5,198,752 A | 3/1993 | Miyata et al. |
| 4,912,399 A | 3/1990 | Greub et al. | 5,198,753 A | 3/1993 | Hamburgen |
| 4,916,002 A | 4/1990 | Carver | 5,202,558 A | 4/1993 | Barker |
| 4,916,398 A | 4/1990 | Rath | 5,202,648 A | 4/1993 | McCandless |
| 4,918,373 A | 4/1990 | Newberg | 5,207,585 A | 5/1993 | Byrnes et al. |
| 4,918,383 A | 4/1990 | Huff et al. | 5,214,243 A | 5/1993 | Johnson |
| 4,922,128 A | 5/1990 | Dhong et al. | 5,214,374 A | 5/1993 | St. Onge |
| 4,922,186 A | 5/1990 | Tsuchiya et al. | 5,225,037 A | 7/1993 | Elder et al. |
| 4,922,912 A | 5/1990 | Watanabe | 5,227,730 A | 7/1993 | King et al. |
| 4,926,172 A | 5/1990 | Gorsek | 5,232,789 A | 8/1993 | Platz et al. |
| 4,929,893 A | 5/1990 | Sato et al. | 5,233,197 A | 8/1993 | Bowman et al. |
| 4,965,514 A | 10/1990 | Herrick | 5,233,306 A | 8/1993 | Misra |
| 4,970,386 A | 11/1990 | Buck | 5,245,292 A | 9/1993 | Milesky et al. |
| 4,972,073 A | 11/1990 | Lessing | 5,266,889 A | 11/1993 | Harwood et al. |
| 4,975,638 A | 12/1990 | Evans et al. | 5,266,963 A | 11/1993 | Carter |
| 4,980,637 A | 12/1990 | Huff et al. | 5,267,088 A | 11/1993 | Nomura |

| | | | | | |
|---|---|---|---|---|---|
| 5,270,664 A | 12/1993 | McMurty et al. | 5,523,694 A | 6/1996 | Cole, Jr. |
| 5,274,336 A | 12/1993 | Crook et al. | 5,527,372 A | 6/1996 | Albrecht et al. |
| 5,280,156 A | 1/1994 | Niori et al. | 5,528,158 A | 6/1996 | Sinsheimer et al. |
| 5,281,364 A | 1/1994 | Stirling et al. | 5,530,372 A | 6/1996 | Lee et al. |
| 5,289,117 A | 2/1994 | Van Loan et al. | 5,531,022 A | 7/1996 | Beaman et al. |
| 5,293,175 A | 3/1994 | Hemmie et al. | 5,532,608 A | 7/1996 | Behfar-Rad et al. |
| 5,298,972 A | 3/1994 | Heffner | 5,537,372 A | 7/1996 | Albrecht et al. |
| 5,304,924 A | 4/1994 | Yamano et al. | 5,539,323 A | 7/1996 | Davis, Jr. |
| 5,308,250 A | 5/1994 | Walz | 5,539,676 A | 7/1996 | Yamaguchi |
| 5,313,157 A | 5/1994 | Pasiecznik, Jr. | 5,550,481 A | 8/1996 | Holmes et al. |
| 5,315,237 A | 5/1994 | Iwakura et al. | 5,561,378 A | 10/1996 | Bockelman et al. |
| 5,316,435 A | 5/1994 | Mozingo | 5,565,788 A | 10/1996 | Burr et al. |
| 5,317,656 A | 5/1994 | Moslehi et al. | 5,565,881 A | 10/1996 | Phillips et al. |
| 5,321,352 A | 6/1994 | Takebuchi | 5,569,591 A | 10/1996 | Kell et al. |
| 5,321,453 A | 6/1994 | Mori et al. | 5,571,324 A | 11/1996 | Sago et al. |
| 5,326,412 A | 7/1994 | Schreiber et al. | 5,578,932 A | 11/1996 | Adamian |
| 5,334,931 A | 8/1994 | Clarke et al. | 5,583,445 A | 12/1996 | Mullen |
| 5,347,204 A | 9/1994 | Gregory et al. | 5,584,120 A | 12/1996 | Roberts |
| 5,355,079 A | 10/1994 | Evans et al. | 5,584,608 A | 12/1996 | Gillespie |
| 5,357,211 A | 10/1994 | Bryson et al. | 5,589,781 A | 12/1996 | Higgins et al. |
| 5,360,312 A | 11/1994 | Mozingo | 5,594,358 A | 1/1997 | Ishikawa et al. |
| 5,361,049 A | 11/1994 | Rubin et al. | 5,600,256 A | 2/1997 | Woith et al. |
| 5,363,050 A | 11/1994 | Guo et al. | 5,601,740 A | 2/1997 | Eldridge et al. |
| 5,367,165 A | 11/1994 | Toda et al. | 5,610,529 A | 3/1997 | Schwindt |
| 5,369,368 A | 11/1994 | Kassen et al. | 5,611,008 A | 3/1997 | Yap |
| 5,371,654 A | 12/1994 | Beaman et al. | 5,617,035 A | 4/1997 | Swapp |
| 5,373,231 A | 12/1994 | Boll et al. | 5,621,333 A | 4/1997 | Long et al. |
| 5,374,938 A | 12/1994 | Hatazawa et al. | 5,621,400 A | 4/1997 | Corbi |
| 5,376,790 A | 12/1994 | Linker et al. | 5,623,213 A | 4/1997 | Liu et al. |
| 5,383,787 A | 1/1995 | Switky et al. | 5,623,214 A | 4/1997 | Pasiecznik, Jr. |
| 5,389,885 A | 2/1995 | Swart | 5,627,473 A | 5/1997 | Takami |
| 5,395,253 A | 3/1995 | Crumly | 5,628,057 A | 5/1997 | Phillips et al. |
| 5,397,855 A | 3/1995 | Ferlier | 5,629,838 A | 5/1997 | Knight et al. |
| 5,404,111 A | 4/1995 | Mori et al. | 5,631,571 A | 5/1997 | Spaziani et al. |
| 5,408,188 A | 4/1995 | Katoh | 5,633,780 A | 5/1997 | Cronin |
| 5,408,189 A | 4/1995 | Swart et al. | 5,635,846 A | 6/1997 | Beaman et al. |
| 5,412,330 A | 5/1995 | Ravel et al. | 5,642,298 A | 6/1997 | Mallory et al. |
| 5,412,866 A | 5/1995 | Woith et al. | 5,644,248 A | 7/1997 | Fujimoto |
| 5,414,565 A | 5/1995 | Sullivan et al. | 5,653,939 A | 8/1997 | Hollis et al. |
| 5,422,574 A | 6/1995 | Kister | 5,656,942 A | 8/1997 | Watts et al. |
| 5,430,813 A | 7/1995 | Anderson et al. | 5,659,421 A | 8/1997 | Rahmel et al. |
| 5,441,690 A | 8/1995 | Ayala-Esquilin et al. | 5,666,063 A | 9/1997 | Abercrombie et al. |
| 5,451,884 A | 9/1995 | Sauerland | 5,669,316 A | 9/1997 | Faz et al. |
| 5,453,404 A | 9/1995 | Leedy | 5,670,322 A | 9/1997 | Eggers et al. |
| 5,457,398 A | 10/1995 | Schwindt et al. | 5,670,888 A | 9/1997 | Cheng |
| 5,463,324 A | 10/1995 | Wardwell et al. | 5,672,816 A | 9/1997 | Park et al. |
| 5,467,024 A | 11/1995 | Swapp | 5,675,499 A | 10/1997 | Lee et al. |
| 5,469,324 A | 11/1995 | Henderson et al. | 5,675,932 A | 10/1997 | Mauney |
| 5,471,185 A | 11/1995 | Shea et al. | 5,676,360 A | 10/1997 | Boucher et al. |
| 5,475,316 A | 12/1995 | Hurley et al. | 5,678,210 A | 10/1997 | Hannah |
| 5,476,211 A | 12/1995 | Khandros | 5,685,232 A | 11/1997 | Inoue |
| 5,477,011 A | 12/1995 | Singles et al. | 5,686,317 A | 11/1997 | Akram et al. |
| 5,478,748 A | 12/1995 | Akins, Jr. et al. | 5,686,960 A | 11/1997 | Sussman et al. |
| 5,479,108 A | 12/1995 | Cheng | 5,688,618 A | 11/1997 | Hulderman et al. |
| 5,479,109 A | 12/1995 | Lau et al. | 5,700,844 A | 12/1997 | Hedrick et al. |
| 5,481,196 A | 1/1996 | Nosov | 5,704,355 A | 1/1998 | Bridges |
| 5,481,936 A | 1/1996 | Yanagisawa | 5,715,819 A | 2/1998 | Svenson et al. |
| 5,487,999 A | 1/1996 | Farnworth | 5,720,098 A | 2/1998 | Kister |
| 5,488,954 A | 2/1996 | Sleva et al. | 5,723,347 A | 3/1998 | Kirano et al. |
| 5,491,425 A | 2/1996 | Watanabe et al. | 5,726,211 A | 3/1998 | Hedrick et al. |
| 5,493,070 A | 2/1996 | Habu | 5,728,091 A | 3/1998 | Payne et al. |
| 5,493,236 A | 2/1996 | Ishii et al. | 5,729,150 A | 3/1998 | Schwindt |
| 5,500,606 A | 3/1996 | Holmes | 5,731,920 A | 3/1998 | Katsuragawa |
| 5,505,150 A | 4/1996 | James et al. | 5,742,174 A | 4/1998 | Kister et al. |
| 5,506,498 A | 4/1996 | Anderson et al. | 5,744,971 A | 4/1998 | Chan et al. |
| 5,506,515 A | 4/1996 | Godshalk et al. | 5,748,506 A | 5/1998 | Bockelman |
| 5,507,652 A | 4/1996 | Wardwell | 5,751,153 A | 5/1998 | Bockelman |
| 5,510,792 A | 4/1996 | Ono et al. | 5,751,252 A | 5/1998 | Phillips |
| 5,511,010 A | 4/1996 | Burns | 5,756,021 A | 5/1998 | Bedrick et al. |
| 5,512,835 A | 4/1996 | Rivera et al. | 5,756,908 A | 5/1998 | Knollmeyer et al. |
| 5,517,126 A | 5/1996 | Yamaguchi | 5,764,070 A | 6/1998 | Pedder |
| 5,521,518 A | 5/1996 | Higgins | 5,767,690 A | 6/1998 | Fujimoto |
| 5,521,522 A | 5/1996 | Abe et al. | 5,772,451 A | 6/1998 | Dozier, II et al. |

| | | | | | |
|---|---|---|---|---|---|
| 5,773,780 A | 6/1998 | Eldridge et al. | 5,977,783 A | 11/1999 | Takayama et al. |
| 5,777,485 A | 7/1998 | Tanaka et al. | 5,981,268 A | 11/1999 | Kovacs et al. |
| 5,785,538 A | 7/1998 | Beaman et al. | 5,982,166 A | 11/1999 | Mautz |
| 5,792,668 A | 8/1998 | Fuller et al. | 5,983,493 A | 11/1999 | Eldridge et al. |
| 5,793,213 A | 8/1998 | Bockelman et al. | 5,993,611 A | 11/1999 | Moroney, III et al. |
| 5,794,133 A | 8/1998 | Kashima | 5,994,152 A | 11/1999 | Khandros et al. |
| 5,803,607 A | 9/1998 | Jones et al. | 5,995,914 A | 11/1999 | Cabot |
| 5,804,607 A | 9/1998 | Hedrick et al. | 5,996,102 A | 11/1999 | Haulin |
| 5,804,982 A | 9/1998 | Lo et al. | 5,998,228 A | 12/1999 | Eldridge et al. |
| 5,804,983 A | 9/1998 | Nakajima et al. | 5,998,768 A | 12/1999 | Hunter et al. |
| 5,806,181 A | 9/1998 | Khandros et al. | 5,998,864 A | 12/1999 | Khandros et al. |
| 5,807,107 A | 9/1998 | Bright et al. | 5,999,268 A | 12/1999 | Yonezawa et al. |
| 5,808,874 A | 9/1998 | Smith | 6,001,760 A | 12/1999 | Katsuda et al. |
| 5,810,607 A | 9/1998 | Shih et al. | 6,002,426 A | 12/1999 | Back et al. |
| 5,811,751 A | 9/1998 | Leona et al. | 6,006,002 A | 12/1999 | Motok et al. |
| 5,811,982 A | 9/1998 | Beaman et al. | 6,013,586 A | 1/2000 | McGhee et al. |
| 5,813,847 A | 9/1998 | Eroglu et al. | 6,019,612 A | 2/2000 | Hasegawa et al. |
| 5,814,847 A | 9/1998 | Shihadeh et al. | 6,023,103 A | 2/2000 | Chang et al. |
| 5,820,014 A | 10/1998 | Dozier, II et al. | 6,028,435 A | 2/2000 | Nikawa |
| 5,821,763 A | 10/1998 | Beaman et al. | 6,029,344 A | 2/2000 | Khandros et al. |
| 5,824,494 A | 10/1998 | Feldberg | 6,031,383 A | 2/2000 | Streib et al. |
| 5,829,128 A | 11/1998 | Eldridge et al. | 6,032,356 A | 3/2000 | Eldridge et al. |
| 5,829,437 A | 11/1998 | Bridges | 6,032,714 A | 3/2000 | Fenton |
| 5,831,442 A | 11/1998 | Heigl | 6,033,935 A | 3/2000 | Dozier, II et al. |
| 5,832,601 A | 11/1998 | Eldridge et al. | 6,034,533 A | 3/2000 | Tervo et al. |
| 5,833,601 A | 11/1998 | Swartz et al. | 6,037,785 A | 3/2000 | Higgins |
| 5,838,160 A | 11/1998 | Beaman et al. | 6,040,739 A | 3/2000 | Wedeen et al. |
| 5,841,288 A | 11/1998 | Meaney et al. | 6,042,712 A | 3/2000 | Mathieu |
| 5,841,342 A | 11/1998 | Hegmann et al. | 6,043,563 A | 3/2000 | Eldridge et al. |
| 5,846,708 A | 12/1998 | Hollis et al. | 6,046,599 A | 4/2000 | Long et al. |
| 5,847,569 A | 12/1998 | Ho et al. | 6,049,216 A | 4/2000 | Yang et al. |
| 5,848,500 A | 12/1998 | Kirk | 6,049,976 A | 4/2000 | Khandros |
| 5,852,232 A | 12/1998 | Samsavar et al. | 6,050,829 A | 4/2000 | Eldridge et al. |
| 5,852,871 A | 12/1998 | Khandros | 6,051,422 A | 4/2000 | Kovacs et al. |
| 5,854,608 A | 12/1998 | Leisten | 6,052,653 A | 4/2000 | Mazur et al. |
| 5,864,946 A | 2/1999 | Eldridge et al. | 6,054,651 A | 4/2000 | Fogel et al. |
| 5,867,073 A | 2/1999 | Weinreb et al. | 6,054,869 A | 4/2000 | Hutton et al. |
| 5,869,326 A | 2/1999 | Hofmann | 6,059,982 A | 5/2000 | Palagonia et al. |
| 5,869,974 A | 2/1999 | Akram et al. | 6,060,888 A | 5/2000 | Blackham et al. |
| 5,874,361 A | 2/1999 | Collins et al. | 6,060,892 A | 5/2000 | Yamagata |
| 5,876,082 A | 3/1999 | Kempf et al. | 6,061,589 A | 5/2000 | Bridges et al. |
| 5,878,486 A | 3/1999 | Eldridge et al. | 6,062,879 A | 5/2000 | Beaman et al. |
| 5,879,289 A | 3/1999 | Yarush et al. | 6,064,213 A | 5/2000 | Khandros et al. |
| 5,883,522 A | 3/1999 | O'Boyle | 6,064,217 A | 5/2000 | Smith |
| 5,883,523 A | 3/1999 | Ferland et al. | 6,064,218 A | 5/2000 | Godfrey et al. |
| 5,884,398 A | 3/1999 | Eldridge et al. | 6,066,911 A | 5/2000 | Lindemann et al. |
| 5,888,075 A | 3/1999 | Hasegawa et al. | 6,071,009 A | 6/2000 | Clyne |
| 5,892,539 A | 4/1999 | Colvin | 6,078,183 A | 6/2000 | Cole, Jr. |
| 5,896,038 A | 4/1999 | Budnaitis et al. | 6,078,500 A | 6/2000 | Beaman et al. |
| 5,900,737 A | 5/1999 | Graham et al. | 6,090,261 A | 7/2000 | Mathieu |
| 5,900,738 A | 5/1999 | Khandros et al. | 6,091,236 A | 7/2000 | Piety et al. |
| 5,903,143 A | 5/1999 | Mochizuki et al. | 6,091,255 A | 7/2000 | Godfrey |
| 5,905,421 A | 5/1999 | Oldfield | 6,091,256 A | 7/2000 | Long et al. |
| 5,910,727 A | 6/1999 | Fujihara et al. | 6,096,561 A | 8/2000 | Kaplan et al. |
| 5,912,046 A | 6/1999 | Eldridge et al. | 6,096,567 A | 8/2000 | Kaplan et al. |
| 5,914,613 A | 6/1999 | Gleason et al. | 6,100,815 A | 8/2000 | Pailthorp |
| 5,914,614 A | 6/1999 | Beaman et al. | 6,104,201 A | 8/2000 | Beaman et al. |
| 5,916,689 A | 6/1999 | Collins et al. | 6,104,206 A | 8/2000 | Verkull |
| 5,917,707 A | 6/1999 | Khandros et al. | 6,110,823 A | 8/2000 | Eldridge et al. |
| 5,923,180 A | 7/1999 | Botka et al. | 6,114,864 A | 9/2000 | Soejima et al. |
| 5,926,029 A | 7/1999 | Ference et al. | 6,114,865 A | 9/2000 | Lagowski et al. |
| 5,926,951 A | 7/1999 | Khandros et al. | 6,118,287 A | 9/2000 | Boll et al. |
| 5,940,965 A | 8/1999 | Uhling et al. | 6,118,894 A | 9/2000 | Schwartz et al. |
| 5,944,093 A | 8/1999 | Viswanath | 6,121,836 A | 9/2000 | Vallencourt |
| 5,945,836 A | 8/1999 | Sayre et al. | 6,124,725 A | 9/2000 | Sato |
| 5,949,383 A | 9/1999 | Hayes et al. | 6,127,831 A | 10/2000 | Khoury et al. |
| 5,949,579 A | 9/1999 | Baker | 6,130,536 A | 10/2000 | Powell et al. |
| 5,959,461 A | 9/1999 | Brown et al. | 6,137,302 A | 10/2000 | Schwindt |
| 5,963,364 A | 10/1999 | Leong et al. | 6,144,212 A | 11/2000 | Mizuta |
| 5,966,645 A | 10/1999 | Davis | 6,146,908 A | 11/2000 | Falque et al. |
| 5,970,429 A | 10/1999 | Martin | 6,147,502 A | 11/2000 | Fryer et al. |
| 5,973,504 A | 10/1999 | Chong | 6,147,851 A | 11/2000 | Anderson |
| 5,974,662 A | 11/1999 | Eldridge et al. | 6,150,186 A | 11/2000 | Chen et al. |

| Patent No. | Date | Inventor(s) |
|---|---|---|
| 6,160,407 A | 12/2000 | Nikawa |
| 6,166,553 A | 12/2000 | Sinsheimer |
| 6,168,974 B1 | 1/2001 | Chang et al. |
| 6,169,410 B1 | 1/2001 | Grace et al. |
| 6,172,337 B1 | 1/2001 | Johnsgard et al. |
| 6,174,744 B1 | 1/2001 | Watanabe et al. |
| 6,175,228 B1 | 1/2001 | Zamborelli et al. |
| 6,176,091 B1 | 1/2001 | Kishi et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,201,453 B1 | 3/2001 | Chan et al. |
| 6,206,273 B1 | 3/2001 | Beaman et al. |
| 6,208,225 B1 | 3/2001 | Miller |
| RE37,130 E | 4/2001 | Fiori, Jr. |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathiue et al. |
| 6,256,882 B1 | 7/2001 | Gleason et al. |
| 6,257,564 B1 | 7/2001 | Avneri et al. |
| 6,257,565 B1 | 7/2001 | Avneri et al. |
| 6,259,260 B1 | 7/2001 | Smith et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Mühlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penney et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |

| | | | | | | |
|---|---|---|---|---|---|---|
| 6,572,608 B1 | 6/2003 | Lee et al. | | 6,741,085 B1 | 5/2004 | Khandros et al. |
| 6,573,702 B2 | 6/2003 | Marcuse et al. | | 6,741,092 B2 | 5/2004 | Eldridge et al. |
| 6,578,264 B1 | 6/2003 | Gleason et al. | | 6,741,129 B1 | 5/2004 | Corsi et al. |
| 6,580,283 B1 | 6/2003 | Carbone et al. | | 6,744,268 B2 | 6/2004 | Hollman |
| 6,582,979 B2 | 6/2003 | Coccioli et al. | | 6,753,679 B1 | 6/2004 | Kwong et al. |
| 6,587,327 B1 | 7/2003 | Devoe et al. | | 6,753,699 B2 | 6/2004 | Stockstad |
| 6,597,187 B2 | 7/2003 | Eldridge et al. | | 6,759,311 B2 | 7/2004 | Eldridge et al. |
| 6,603,322 B1 | 8/2003 | Boll et al. | | 6,759,859 B2 | 7/2004 | Deng et al. |
| 6,603,323 B1 | 8/2003 | Miller et al. | | 6,764,869 B2 | 7/2004 | Eldridge et al. |
| 6,603,324 B2 | 8/2003 | Eldridge et al. | | 6,768,328 B2 | 7/2004 | Self et al. |
| 6,605,941 B2 | 8/2003 | Abe | | 6,770,955 B1 | 8/2004 | Coccioli et al. |
| 6,605,951 B1 | 8/2003 | Cowan | | 6,771,806 B1 | 8/2004 | Satya et al. |
| 6,605,955 B1 | 8/2003 | Costello et al. | | 6,777,319 B2 | 8/2004 | Grube et al. |
| 6,606,014 B2 | 8/2003 | Miller | | 6,778,140 B1 | 8/2004 | Yeh |
| 6,606,575 B2 | 8/2003 | Miller | | 6,778,406 B2 | 8/2004 | Eldridge et al. |
| 6,608,494 B1 | 8/2003 | Bruce et al. | | 6,780,001 B2 | 8/2004 | Eldridge et al. |
| 6,611,417 B2 | 8/2003 | Chen | | 6,784,674 B2 | 8/2004 | Miller |
| 6,615,485 B2 | 9/2003 | Eldridge et al. | | 6,784,677 B2 | 8/2004 | Miller |
| 6,616,966 B2 | 9/2003 | Mathieu et al. | | 6,784,679 B2 | 8/2004 | Sweet et al. |
| 6,617,862 B1 | 9/2003 | Bruce | | 6,788,093 B2 | 9/2004 | Aitren et al. |
| 6,617,866 B1 | 9/2003 | Ickes | | 6,788,094 B2 | 9/2004 | Khandros et al. |
| 6,621,082 B2 | 9/2003 | Morita et al. | | 6,791,176 B2 | 9/2004 | Mathieu et al. |
| 6,621,260 B2 | 9/2003 | Eldridge et al. | | 6,794,888 B2 | 9/2004 | Kawaguchi et al. |
| 6,622,103 B1 | 9/2003 | Miller | | 6,794,934 B2 | 9/2004 | Betti-Berutto et al. |
| 6,624,648 B2 | 9/2003 | Eldridge et al. | | 6,794,950 B2 | 9/2004 | Du Toit et al. |
| 6,627,461 B2 | 9/2003 | Chapman et al. | | 6,798,225 B2 | 9/2004 | Miller |
| 6,627,483 B2 | 9/2003 | Ondricek et al. | | 6,798,226 B2 | 9/2004 | Altmann et al. |
| 6,627,980 B2 | 9/2003 | Eldridge | | 6,806,724 B2 | 10/2004 | Hayden et al. |
| 6,628,503 B2 | 9/2003 | Sogard | | 6,806,836 B2 | 10/2004 | Ogawa et al. |
| 6,628,980 B2 | 9/2003 | Atalar et al. | | 6,807,734 B2 | 10/2004 | Eldridge et al. |
| 6,633,174 B1 | 10/2003 | Satya et al. | | 6,809,533 B1 | 10/2004 | Anlage et al. |
| 6,636,182 B2 | 10/2003 | Mehltretter | | 6,811,406 B2 | 11/2004 | Grube |
| 6,639,461 B1 | 10/2003 | Tam et al. | | 6,812,691 B2 | 11/2004 | Miller |
| 6,640,415 B2 | 11/2003 | Eslamy et al. | | 6,812,718 B1 | 11/2004 | Chong et al. |
| 6,640,432 B1 | 11/2003 | Mathieu et al. | | 6,815,963 B2 | 11/2004 | Gleason et al. |
| 6,642,625 B2 | 11/2003 | Dozier, II et al. | | 6,816,031 B1 | 11/2004 | Miller |
| 6,643,597 B1 | 11/2003 | Dunsmore | | 6,816,840 B1 | 11/2004 | Goodwin, III |
| 6,644,982 B1 | 11/2003 | Ondricek et al. | | 6,817,052 B2 | 11/2004 | Grube |
| 6,646,520 B2 | 11/2003 | Miller | | 6,818,840 B2 | 11/2004 | Khandros |
| 6,653,903 B2 | 11/2003 | Leich et al. | | 6,822,463 B1 | 11/2004 | Jacobs |
| 6,655,023 B1 | 12/2003 | Eldridge et al. | | 6,822,529 B2 | 11/2004 | Miller |
| 6,657,455 B2 | 12/2003 | Eldridge et al. | | 6,825,052 B2 | 11/2004 | Eldridge et al. |
| 6,657,601 B2 | 12/2003 | McLean | | 6,825,422 B2 | 11/2004 | Eldridge et al. |
| 6,661,316 B2 | 12/2003 | Hreish et al. | | 6,827,582 B2 | 12/2004 | Mathieu et al. |
| 6,664,628 B2 | 12/2003 | Khandros et al. | | 6,827,584 B2 | 12/2004 | Mathieu et al. |
| 6,669,489 B1 | 12/2003 | Dozier, II et al. | | 6,835,898 B2 | 12/2004 | Eldridge et al. |
| 6,672,875 B1 | 1/2004 | Mathieu et al. | | 6,836,962 B2 | 1/2005 | Khandros et al. |
| 6,677,744 B1 | 1/2004 | Long | | 6,838,885 B2 | 1/2005 | Kamitani |
| 6,678,850 B2 | 1/2004 | Roy et al. | | 6,838,893 B2 | 1/2005 | Khandros et al. |
| 6,678,876 B2 | 1/2004 | Stevens et al. | | 6,839,964 B2 | 1/2005 | Henson |
| 6,680,659 B2 | 1/2004 | Miller | | 6,845,491 B2 | 1/2005 | Miller et al. |
| 6,685,817 B1 | 2/2004 | Mathieu | | 6,850,082 B2 | 2/2005 | Schwindt |
| 6,686,754 B2 | 2/2004 | Miller | | 6,856,129 B2 | 2/2005 | Thomas et al. |
| 6,690,185 B1 | 2/2004 | Khandros et al. | | 6,856,150 B2 | 2/2005 | Sporck et al. |
| 6,701,265 B2 | 3/2004 | Hill et al. | | 6,862,727 B2 | 3/2005 | Stevens |
| 6,701,612 B2 | 3/2004 | Khandros et al. | | 6,864,105 B2 | 3/2005 | Grube et al. |
| 6,707,548 B2 | 3/2004 | Kreimer et al. | | 6,864,694 B2 | 3/2005 | McTigue |
| 6,708,403 B2 | 3/2004 | Beaman et al. | | 6,870,359 B1 | 3/2005 | Sekel |
| 6,710,798 B1 | 3/2004 | Hershel et al. | | 6,870,381 B2 | 3/2005 | Grube |
| 6,713,374 B2 | 3/2004 | Eldridge et al. | | 6,882,239 B2 | 4/2005 | Miller |
| 6,714,828 B2 | 3/2004 | Eldridge et al. | | 6,882,546 B2 | 4/2005 | Miller |
| 6,717,426 B2 | 4/2004 | Iwasaki | | 6,887,723 B1 | 5/2005 | Ondricek et al. |
| 6,720,501 B1 | 4/2004 | Henson | | 6,888,362 B2 | 5/2005 | Eldridge et al. |
| 6,722,032 B2 | 4/2004 | Beaman et al. | | 6,891,385 B2 | 5/2005 | Miller |
| 6,724,205 B1 | 4/2004 | Hayden et al. | | 6,900,646 B2 | 5/2005 | Kasukabe et al. |
| 6,724,928 B1 | 4/2004 | Davis | | 6,900,647 B2 | 5/2005 | Yoshida et al. |
| 6,727,579 B1 | 4/2004 | Eldridge et al. | | 6,900,652 B2 | 5/2005 | Mazur |
| 6,727,580 B1 | 4/2004 | Eldridge et al. | | 6,900,653 B2 | 5/2005 | Yu et al. |
| 6,727,716 B1 | 4/2004 | Sharif | | 6,902,416 B2 | 6/2005 | Feldman |
| 6,729,019 B2 | 5/2004 | Grube et al. | | 6,902,941 B2 | 6/2005 | Sun |
| 6,731,804 B1 | 5/2004 | Carrieri et al. | | 6,903,563 B2 | 6/2005 | Yoshida et al. |
| 6,734,687 B1 | 5/2004 | Ishitani et al. | | 6,906,506 B1 | 6/2005 | Reano et al. |
| 6,737,920 B2 | 5/2004 | Jen et al. | | 6,906,539 B2 | 6/2005 | Wilson et al. |

| | | |
|---|---|---|
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,375 B2 | 9/2005 | Karavakis et al. |
| 6,946,859 B2 | 9/2005 | Karavakis et al. |
| 6,946,860 B2 | 9/2005 | Cheng et al. |
| 6,946,864 B2 | 9/2005 | Gramann et al. |
| 6,948,391 B2 | 9/2005 | Brassell et al. |
| 6,948,981 B2 | 9/2005 | Pade |
| 6,949,942 B2 | 9/2005 | Eldridge et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,328 B1 | 4/2006 | Beerling |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,042,236 B1 * | 5/2006 | Wollitzer .................... 324/754 |
| 7,057,404 B2 | 6/2006 | Gleason et al. |
| 7,071,722 B2 | 7/2006 | Yamada et al. |
| 7,088,981 B2 | 8/2006 | Chang |
| 7,096,133 B1 | 8/2006 | Martin et al. |
| 7,161,363 B2 | 1/2007 | Gleason et al. |
| 7,173,433 B2 | 2/2007 | Hoshi et al. |
| 7,187,188 B2 | 3/2007 | Andrews et al. |
| 7,188,037 B2 | 3/2007 | Hidehira |
| 7,219,416 B2 | 5/2007 | Inoue et al. |
| 7,233,160 B2 | 6/2007 | Hayden et al. |
| 7,253,646 B2 | 8/2007 | Lou et al. |
| 7,271,603 B2 | 9/2007 | Gleason et al. |
| 7,276,922 B2 | 10/2007 | Miller et al. |
| 7,315,175 B2 | 1/2008 | Cole |
| 7,319,335 B2 | 1/2008 | Brunner et al. |
| 7,319,337 B2 | 1/2008 | Sakata |
| 7,323,680 B2 | 1/2008 | Chong |
| 7,323,899 B2 | 1/2008 | Schuette et al. |
| 7,327,153 B2 | 2/2008 | Weinraub |
| 7,332,918 B2 | 2/2008 | Sugiyama et al. |
| 7,332,923 B2 | 2/2008 | Schott et al. |
| 7,342,402 B2 | 3/2008 | Kim et al. |
| 7,403,028 B2 | 7/2008 | Campbell |
| 7,427,868 B2 * | 9/2008 | Strid et al. .................. 324/754 |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |

| | | | | | | |
|---|---|---|---|---|---|---|
| 2002/0011859 A1 | 1/2002 | Smith et al. | | 2005/0088191 A1 | 4/2005 | Lesher |
| 2002/0011863 A1 | 1/2002 | Takahashi et al. | | 2005/0101846 A1 | 5/2005 | Fine et al. |
| 2002/0030480 A1 | 3/2002 | Appen et al. | | 2005/0116730 A1 | 6/2005 | Hsu |
| 2002/0050828 A1 | 5/2002 | Seward, IV et al. | | 2005/0142033 A1 | 6/2005 | Glezer et al. |
| 2002/0070743 A1 | 6/2002 | Felici et al. | | 2005/0151548 A1 | 7/2005 | Hayden et al. |
| 2002/0070745 A1 | 6/2002 | Johnson et al. | | 2005/0156675 A1 | 7/2005 | Rohde et al. |
| 2002/0079911 A1 | 6/2002 | Schwindt | | 2005/0164160 A1 | 7/2005 | Gunter et al. |
| 2002/0105396 A1 | 8/2002 | Streeter et al. | | 2005/0165316 A1 | 7/2005 | Lowery et al. |
| 2002/0109088 A1 | 8/2002 | Nara et al. | | 2005/0168722 A1 | 8/2005 | Forstner et al. |
| 2002/0118034 A1 | 8/2002 | Laureanti | | 2005/0172703 A1 | 8/2005 | Kley |
| 2002/0149377 A1 | 10/2002 | Hefti et al. | | 2005/0174191 A1 | 8/2005 | Brunker et al. |
| 2002/0153909 A1 | 10/2002 | Petersen et al. | | 2005/0178980 A1 | 8/2005 | Skidmore et al. |
| 2002/0163769 A1 | 11/2002 | Brown | | 2005/0179444 A1 | 8/2005 | Tiemeijer |
| 2002/0168659 A1 | 11/2002 | Hefti et al. | | 2005/0184742 A1 | 8/2005 | Huang et al. |
| 2002/0176160 A1 | 11/2002 | Suzuki et al. | | 2005/0195124 A1 | 9/2005 | Baliarda et al. |
| 2002/0180466 A1 | 12/2002 | Hiramatsu et al. | | 2005/0229053 A1 | 10/2005 | Sunter |
| 2002/0197709 A1 | 12/2002 | Van der Weide et al. | | 2005/0236587 A1 | 10/2005 | Kodama et al. |
| 2003/0010877 A1 | 1/2003 | Landreville et al. | | 2005/0237102 A1 | 10/2005 | Tanaka |
| 2003/0030822 A1 | 2/2003 | Finarov | | 2006/0030060 A1 | 2/2006 | Noguchi et al. |
| 2003/0032000 A1 | 2/2003 | Liu et al. | | 2006/0052075 A1 | 3/2006 | Galivanche et al. |
| 2003/0040004 A1 | 2/2003 | Hefti et al. | | 2006/0155270 A1 | 7/2006 | Hancock et al. |
| 2003/0057513 A1 | 3/2003 | Leedy | | 2006/0184041 A1 | 8/2006 | Andrews et al. |
| 2003/0062915 A1 | 4/2003 | Arnold et al. | | 2006/0220663 A1 | 10/2006 | Oikawa |
| 2003/0072549 A1 | 4/2003 | Facer et al. | | 2006/0226864 A1 | 10/2006 | Kramer |
| 2003/0076585 A1 | 4/2003 | Ledley | | 2007/0024506 A1 | 2/2007 | Hardacker |
| 2003/0077649 A1 | 4/2003 | Cho et al. | | 2007/0030021 A1 | 2/2007 | Cowan et al. |
| 2003/0088180 A1 | 5/2003 | Van Veen et al. | | 2007/0145989 A1 | 6/2007 | Zhu et al. |
| 2003/0119057 A1 | 6/2003 | Gascoyne et al. | | 2008/0111571 A1 | 5/2008 | Smith et al. |
| 2003/0139662 A1 | 7/2003 | Seidman | | | | |
| 2003/0139790 A1 | 7/2003 | Ingle et al. | | FOREIGN PATENT DOCUMENTS | | |
| 2003/0155939 A1 | 8/2003 | Lutz et al. | | | | |
| 2003/0170898 A1 | 9/2003 | Gundersen et al. | | CN | 1083975 | 3/1994 |
| 2003/0184332 A1 | 10/2003 | Tomimatsu et al. | | DE | 2951072 | 7/1981 |
| 2003/0215966 A1 | 11/2003 | Rolda et al. | | DE | 3426565 | 1/1986 |
| 2003/0234659 A1 | 12/2003 | Zieleman | | DE | 3637549 | 5/1988 |
| 2004/0015060 A1 | 1/2004 | Samsoondar et al. | | DE | 288234 | 3/1991 |
| 2004/0021475 A1 | 2/2004 | Ito et al. | | DE | 4223658 | 1/1993 |
| 2004/0029425 A1 | 2/2004 | Yean et al. | | DE | 9313420 | 10/1993 |
| 2004/0061514 A1 | 4/2004 | Schwindt et al. | | DE | 19522774 | 1/1997 |
| 2004/0066181 A1 | 4/2004 | Theis | | DE | 19542955 | 5/1997 |
| 2004/0069776 A1 | 4/2004 | Fagrell et al. | | DE | 19618717 | 1/1998 |
| 2004/0090223 A1 | 5/2004 | Yonezawa | | DE | 19749687 | 5/1998 |
| 2004/0095145 A1 | 5/2004 | Boudiaf et al. | | DE | 29809568 | 10/1998 |
| 2004/0095641 A1 | 5/2004 | Russum et al. | | DE | 10003282 | 10/2000 |
| 2004/0100276 A1 | 5/2004 | Fanton | | DE | 10000324 | 7/2001 |
| 2004/0100297 A1 | 5/2004 | Tanioka et al. | | DE | 20220754 | 5/2004 |
| 2004/0108847 A1 | 6/2004 | Stoll et al. | | EP | 0230766 | 12/1985 |
| 2004/0113640 A1 | 6/2004 | Cooper et al. | | EP | 0195520 | 9/1986 |
| 2004/0130787 A1 | 7/2004 | Thome-Forster et al. | | EP | 0230348 | 7/1987 |
| 2004/0132222 A1 | 7/2004 | Hembree et al. | | EP | 0259163 | 3/1988 |
| 2004/0134899 A1 | 7/2004 | Hiramatsu et al. | | EP | 0259183 | 3/1988 |
| 2004/0140819 A1 | 7/2004 | McTigue et al. | | EP | 0259942 | 3/1988 |
| 2004/0147034 A1 | 7/2004 | Gore et al. | | EP | 0261986 | 3/1988 |
| 2004/0162689 A1 | 8/2004 | Jamneala et al. | | EP | 0270422 | 6/1988 |
| 2004/0170312 A1 | 9/2004 | Soenksen | | EP | 0333521 | 9/1989 |
| 2004/0175294 A1 | 9/2004 | Ellison et al. | | EP | 0460911 | 12/1991 |
| 2004/0186382 A1 | 9/2004 | Modell et al. | | EP | 0846476 | 6/1998 |
| 2004/0193382 A1 | 9/2004 | Adamian et al. | | EP | 0945736 | 9/1999 |
| 2004/0197771 A1 | 10/2004 | Powers et al. | | GB | 579665 | 8/1946 |
| 2004/0199350 A1 | 10/2004 | Blackham et al. | | GB | 2014315 | 8/1979 |
| 2004/0201388 A1 | 10/2004 | Barr | | GB | 2179458 | 3/1987 |
| 2004/0207072 A1 | 10/2004 | Hiramatsu et al. | | JP | 52-19046 | 2/1977 |
| 2004/0207424 A1 | 10/2004 | Hollman | | JP | 53037077 | 4/1978 |
| 2004/0239338 A1 | 12/2004 | Johnsson et al. | | JP | 53-052354 | 5/1978 |
| 2004/0246004 A1 | 12/2004 | Heuermann | | JP | 55115383 | 9/1980 |
| 2004/0251922 A1 | 12/2004 | Martens et al. | | JP | 56-007439 | 1/1981 |
| 2005/0024069 A1 | 2/2005 | Hayden et al. | | JP | 5691503 | 7/1981 |
| 2005/0026276 A1 | 2/2005 | Chou | | JP | 56088333 | 7/1981 |
| 2005/0030047 A1 | 2/2005 | Adamian | | JP | 57075480 | 5/1982 |
| 2005/0054029 A1 | 3/2005 | Tomimatsu et al. | | JP | 57163035 | 10/1982 |
| 2005/0062533 A1 | 3/2005 | Vice | | JP | 57171805 | 10/1982 |
| 2005/0068054 A1 | 3/2005 | Mok et al. | | JP | 58-130602 | 8/1983 |
| 2005/0083130 A1 | 4/2005 | Grilo | | JP | 594189 U | 1/1984 |

| | | |
|---|---|---|
| JP | 60-5462 | 4/1984 |
| JP | 60-236241 | 11/1985 |
| JP | 61142802 | 6/1986 |
| JP | 62-11243 | 1/1987 |
| JP | 62-51235 | 3/1987 |
| JP | 62-58650 | 3/1987 |
| JP | 62098634 | 5/1987 |
| JP | 62107937 | 5/1987 |
| JP | 62-179126 | 8/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3196206 | 8/1991 |
| JP | 03228348 | 10/1991 |
| JP | 04130639 | 5/1992 |
| JP | 04159043 | 6/1992 |
| JP | 04206930 | 7/1992 |
| JP | 4-340248 | 11/1992 |
| JP | 05082631 | 4/1993 |
| JP | 5157790 | 6/1993 |
| JP | 5-113451 | 7/1993 |
| JP | 5166893 | 7/1993 |
| JP | 6-71425 | 3/1994 |
| JP | 6-85044 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7005078 | 1/1995 |
| JP | 7012871 | 1/1995 |
| JP | 7-201945 | 8/1995 |
| JP | 8035987 | 2/1996 |
| JP | 8-261898 | 10/1996 |
| JP | 08330401 | 12/1996 |
| JP | 09127432 | 5/1997 |
| JP | 10-48256 | 2/1998 |
| JP | 10116866 | 5/1998 |
| JP | 10142260 | 5/1998 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO 96/29629 | 1/1996 |
| WO | WO 97/50001 | 12/1997 |
| WO | WO98/07040 | 2/1998 |
| WO | WO0/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.
Hopper, Samuel, "The Design of Ridged Waveguides," I.R.E. Transactions—Microwave Theory and techniques, No. 5, Oct. 1955, pp. 20-29.
Chen, Tsung-Shan, "Calculation of Parameters of Ridge Waveguides," IRE Transactions on Microwave Theory and Techniques, Jan. 1957, pp. 12-17.
IRE 20.1, Committee Personnel, "IRE Standards on Methods of Measuring Noise in Linear Twoports, 1959," Proc. IRE, vol. 48, pp. 60-68, Jan. 1960, pp. 32-40.
Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.
Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.
Lane, Richard Q., "The Determination of Device Noise Parameters," Proc. IEEE, vol. 57, Aug. 1969, pp. 1461-1462.
Adamian, Vaheh, et al., "A Novel Procedure for Receiver Noise Characterization," IEEE Transactions on Instrumentaton and Measurement, Jun. 1973.
Daly, P., "Polar Geometry Waveguides by finite-element Methods," IEEE Transactions on Microwave Theory and Technique, vol. MTT-22, No. 3, Mar. 1974, pp. 202-209.
Fink, Donald G., et al., "Electronics Engineers' Handbook," Sec. 17-52 Measurement and Control Circuits, 1975, pp. 17-22-17-27.
Bry, A., et al, "Bypass Capacitor for Chip Probe," IBM Technical Disclosure Bulletin, vol. 18, No. 11, Apr. 1976.
Skobern, J.R., "Subminiature High-Frequency Probe," IBM Technical disclosure Bulletin, vol. 19, No. 10, Mar. 1977.
Berg, William, et al., "Elastomers solve tough problems in high-frequency systems," 2119 EDN vol. 23, Jan. 5, 1978, pp. 36-42.
Eisenhart, R.L., "A Better Microstrip Connector," 1978 IEEE MTT-S International Microwave Symposium Digest, Jun. 27-29, Ottawa, Canada.
Gommlich, Hans, et al., "Verzerrungsmessungen-Wichtige Aufgabe in der Ubertragungstechnik," Elektronik 8/ Apr. 23, 1982, pp. 110-119.
Larock, V., et al., "Automatic Noise Temperature Measurement Through Frequency Variation," IEEE Transactions on Microwave Theory and Techniques, vol. MTT-30, No. 8, Aug. 1982, pp. 1286-1288.
Maury Microwave Corp., "Transistor Test Fixture (TTF) Inserts, Calibration & Check Devices, MT951, MT952, MT953 Series," Advanced Data 4T-002, Sep. 20, 1982, pp. 1-2.
Maury Microwave Corp., "Transistor Test Fixture (TTF) Software, " MT950D Series, Sep. 20, 1982, 2 pages.
Maury Microwave Corp., "Transistor Test Fixture (TTF)," MT950 Series, Advanced data 4T-001, Oct. 7, 1982.
Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Design Technique, "Microstrip Microwave Test Fixture," May 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolar Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH3-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim , et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

The Micromanipulator Company, data sheet, Double Sided Probing System, Jul. 2002, 2 pages.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-853.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions on Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Bob Stengel, "Neutralized Differential Amplifiers using Mixed-Mode s-parameters," 2003 IEEE Radio Frequency Integrated Circuits Symposium, pp. 711-714.

* cited by examiner

ACTIVE WAFER PROBE

CROSS-REFERENCE TO RELATED APPLICATIONS

This application is a continuation of U.S. patent application No. 11/019,440, filed Dec. 21, 2004, now U.S. Pat. No. 7,427,868; which application claims the benefit of U.S. Provisional App. Nos. 60/589,346, filed Jul. 20, 2004 and 60/532,756, filed Dec. 24, 2003.

BACKGROUND OF THE INVENTION

A probe suitable for probing a semiconductor wafer that includes an active circuit.

BRIEF SUMMARY OF THE INVENTION

There are many types of probing assemblies that have been developed for the measurement of integrated circuits and other forms of microelectronic devices. One representative type of assembly uses a circuit card on which the upper side is formed of elongate conductive traces that serve as signal and ground lines. A central opening is formed in the card, and a needle-like probe tip is attached to the end of each signal trace adjacent the opening so that a radially extending array of downwardly converging needle-like tips is presented by the assembly for selective connection with the closely spaced pads of the microelectronic device being tested. A probe assembly of this type is shown, for example, in Harmon U.S. Pat. No. 3,445,770. This type of probing assembly, however, is unsuitable for use at higher frequencies, including microwave frequencies in the gigahertz range, because at such frequencies the needle-like tips act as inductive elements and because there are no adjoining elements present to suitably counteract this inductance with a capacitive effect in a manner that would create a broadband characteristic of more or less resistive effect. Accordingly, a probing assembly of the type just described is unsuitable for use at microwave frequencies due to the high levels of signal reflection and substantial inductive losses that occur at the needle-like probe tips.

In order to obtain device measurements at somewhat higher frequencies than are possible with the basic probe card system described above, various related probing systems have been developed. Such probing systems are designed to present a typical transmission line impedance, such as 50 ohms, to the device under test. Such systems are shown, for example, in Evans U.S. Pat. No. 3,849,728; Kikuchi Japanese Publication No. 1-209,380; Sang et al. U.S. Pat. No. 4,749,942; Lao et al. U.S. Pat. No. 4,593,243; and Shahriary U.S. Pat. No. 4,727,319. Yet another related system is shown in Kawanabe Japanese Publication No. 60-223,138 which describes a probe assembly having needle-like tips where the tips extend from a coaxial cable-like structure instead of a probe card. A common feature of each of these systems is that the length of the isolated portion of each needle-like probe tip is limited to the region immediately surrounding the device-under-test in order to minimize the region of discontinuity and the amount of inductive loss. However, this approach has resulted in only limited improvement in higher frequency performance due to various practical limitations in the construction of these types of probes. In Lao et al., for example, the length of each needle-like tip is minimized by using a wide conductive blade to span the distance between each tip and the supporting probe card, and these blades, in turn, are designed to be arranged relative to each other so as to form transmission line structures of stripline type. As a practical matter, however, it is difficult to join the thin vertical edge of each blade to the corresponding trace on the card while maintaining precisely the appropriate amount of face-to-face spacing between the blades and precisely the correct pitch between the ends of the needle-like probe tips.

One type of probing assembly that is capable of providing a controlled-impedance low-loss path between its input terminal and the probe tips, such as a typical transmission line impedance, is shown in Lockwood et al. U.S. Pat. No. 4,697,143. In Lockwood et al., a ground-signal-ground arrangement of strip-like conductive traces is formed on the underside of an alumina substrate so as to form a coplanar transmission line on the substrate. At one end, each associated pair of ground traces and the corresponding interposed signal trace are connected to the outer conductor and the center conductor, respectively, of a coaxial cable connector. At the other end of these traces, areas of wear-resistant conductive material are provided in order to reliably establish electrical connection with the respective pads of the device to be tested. Layers of ferrite-containing microwave absorbing material are mounted about the substrate to absorb spurious microwave energy over a major portion of the length of each ground-signal-ground trace pattern. In accordance with this type of construction, a controlled high-frequency impedance (e.g., 50 ohms) can be presented at the probe tips to the device under test.

To achieve improved spatial conformance between the tip conductors of a probe and an array of non-planar device pads or surfaces, several high-frequency probing assemblies have been developed. Such assemblies are described, for example, in Drake et al. U.S. Pat. No. 4,894,612; Coberly et al. U.S. Pat. No. 4,116,523; and Boll et al. U.S. Pat. No. 4,871,964. Similarly, such probing assembly is designed to present a typical transmission line impedance, such as 50 ohms, to the device under test. The Drake et al. probing assembly includes a substrate on the underside of which are formed a plurality of conductive traces which collectively form a coplanar transmission line. However, in one embodiment shown in Drake et al., the tip end of the substrate is notched so that each trace extends to the end of a separate tooth and the substrate is made of moderately flexible nonceramic material. The moderately flexible substrate permits, at least to a limited extent, independent flexure of each tooth relative to the other teeth so as to enable spatial conformance of the trace ends to slightly non-planar contact surfaces on a device-under-test.

With respect to the probing assembly shown in Boll et al., as cited above, the ground conductors comprise a pair of leaf-spring members the rear portions of which are received into diametrically opposite slots formed on the end of a miniature coaxial cable for electrical connection with the cylindrical outer conductor of that cable. The center conductor of the cable is extended beyond the end of the cable (i.e., as defined by the ends of the outer conductor and the inner dielectric) and is gradually tapered to form a pin-like member having a rounded point. In accordance with this construction, the pin-like extension of the center conductor is disposed in spaced apart generally centered position between the respective forward portions of the leaf-spring members and thereby forms, in combination with these leaf-spring members, a rough approximation to a ground-signal-ground coplanar transmission line structure.

A disadvantage of the probes described above is that the relatively low input impedance of the transmission lines (e.g., 50 ohms) results in the possibility that the testing operation might significantly disturb the signal at the probed pads. Further, the probes impose a relatively significant capacitance to the probed pads which tends to likewise alter the signal at the probed pads. Hence, traditional low impedance probes may have adequate electrical transmission characteristics at high frequencies but are unsuitable for many applications because of the loading as a result of the probe on the circuit to be probed.

Gleason et al., U.S. Pat. No. 4,853,627, disclose a wafer probe with a high input impedance that includes a support member having an end region which is shaped to permit the end region to be brought into close proximity with a component under test. An amplifier with a relatively high input impedance is rigidly mounted on the support member at its end region. An elongate "wire-like" conductive probe element is rigidly attached to the amplifier and is electrically connected to the amplifier's input terminal. A transmission line is connected to the amplifier's output terminal, which normally has a typical transmission line impedance such as 50 ohms, for transmitting signals from the amplifier to a measurement instrument.

While the wafer probe of Gleason et al. provides a relatively high input impedance to the device under test, it imposes significant capacitance to the device under test. In many cases the probe element used for probing has approximately 1 fF per $1,000^{th}$ of an inch (25.4 microns per $1,000^{th}$ of an inch). The elongate "wire-like" conductive probe element of Gleason et al. is approximately 250 microns in length and accordingly has approximately 10 fF of capacitance. The amplifier has approximately another 10 fF thereby presenting approximately 20 fF to the device under test.

A probe that includes an amplifier implemented in silicon is provided by G. G. B. Industries of Gillette, N.J. as Model 34A. The probe includes an elongate "wire-like" conductive probe element that is approximately 3,000 microns in length, thus imposing at least approximately 120 fF in capacitance at 3 GHZ. The amplifier has approximately 10 fF, thereby imposing approximately 130 fF to the device under test. The probe includes a pair of adjacent lines extending partially along the probe element having a "guard potential". However, the capacitance of the 34A probe by G. G. B. Industries tends to significantly increase in capacitance as the frequency increases above 3 GHZ because the phase of the guard conductors becomes out of phase with the signal conductor (probe element).

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Active element based probes, such as those which include a high input resistance and/or low input capacitance amplifier circuit, tend to be suitable for probing circuitry where the addition of a capacitance on the order of approximately 100 fF for devices that are exceptionally small does not present a significant load to the circuitry. Most amplifier circuits include external power using a bias circuit, while passive circuitry may potentially be used. However, in some circumstances the loading of a circuit with 100 fF is simply unacceptable for effective measurements. For example, in some cases an opening is machined on the back side of a wafer that includes circuitry thereon to permit access to a conductive trace interconnecting a pair of transistor elements together, such as a pair of gates. With the continual shrinking of the size of the gate of transistors, together with the decrease in the amount of current used for switching the transistors, the loading of the circuit with a probe having on the order of approximately 100 fF presents an unacceptably large load to the circuit. The capacitive load on the circuit is sufficient that the edge transitions of signals are slowed down significantly, even to the point that the measurements obtained are nearly meaningless since the desired switching time is significantly faster than the loaded circuit can accommodate.

One technique to decrease the capacitance presented to the device under test is to significantly reduce the length of the elongate probing element. For example, the elongate probing element may be reduced from approximately 250 microns (Gleason et al.) or 3000 microns (G.B.B. device 34A), depending on the probe design, to under 150 microns or 2000 in length. This reduces the capacitance loading on the device under test a corresponding amount. Unfortunately, merely reducing the length of the elongate probing element results in a significantly stiffer probing element. The stiffer probing element has both a greater tendency to break the probe if pressed too hard against the device under test and a greater tendency to damage the device under test if pressed too hard because of its inability to bend. Accordingly, merely shortening the probing element is a somewhat ineffective solution because the resulting device has minimal compliance.

Figure 1:
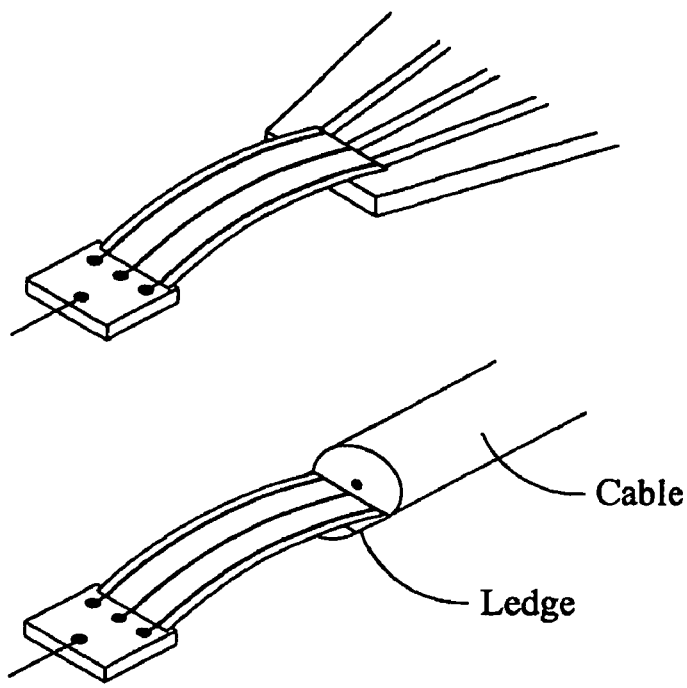
FIG. 1 illustrates a probe, an active circuit, a flexible interconnect, and a supporting structure.

Referring to FIG. 1, in order to permit more effective probing of devices under test with relatively short elongate probing elements the present inventors came to the realization that the compliance for effective probing may be, at least partially, provided by a flexible interconnection between the active element and the supporting structure. The structure may be any suitable support, such as for example, a substrate or shelf of a coaxial cable. In this manner, the length of the elongate probing element may be reduced, such as to 2000 microns, such as to 1000 microns, such as to 500 microns, such as to 200 microns, such as to 150 microns, such as to 100 microns, such as to 75 microns, or more preferably such as to 40 microns or less which reduces the capacitance of the elongate probing element while simultaneously providing additional compliance with the device under test as a result of the flexible interconnection. The flexible material is preferably polyimide, although any suitable material may be used. Depending on the length of the probing element, the resulting capacitance of the probe, as viewed by the device under test, is preferably 18 fF (including 10 fF active element) or less, is thus more preferably 16 fF (including 10 fF active element) or less, is thus more preferably 14 fF (including 10 fF active element) or less, and is thus more preferably 12 fF (including 10 fF active element) or less. The capacitance of the active element may be potentially reduced depending upon the particular amplifier design used. Accordingly, the input capacitance imposed on the device under test is preferably less than 20 fF (including 10 fF active element). The amplifier may be characterized as having an input capacitance of less than 1000 fF, or less than 500 fF, or less than 250 fF, or less than 50 fF, of less than 25 fF and more preferably less than 10 fF. The amplifier circuit preferably has in input impedance substantially greater than 50 ohms, preferably more than 1,000 ohms, preferably more than 100 K ohms, more preferably more than 250 K ohms, more preferably more than 500 K ohms, more preferably an input impedance of more than 1 M ohms, and an output impedance on the order of 50 ohms, preferably less than 1,000 ohms. In many cases, the input impedance is preferably greater than the output impedance, and more preferably the input impedance is 100 times greater than the output impedance, and more preferably the input impedance is 1,000 times greater than the output impedance, and more preferably the input impedance is 10,000 times greater than the output impedance. The output of the amplifier circuit may include a current driver to the transmission line, which may have a high resistance and a low capacitance.

The flexible material preferably supports traces thereon, either on the upper surface or the lower surface, from the supporting structure to the active element. The traces may likewise be encapsulated within the flexible material. Typically the supporting structure provides a type of transmission structure, such as for example, a coplanar waveguide or a strip line configuration. In order to maintain the signal integrity to the active element, the flexible material may include a transmission structure, such as for example, a coplanar waveguide or a strip line configuration. Preferably, the type of transmission structure provided by the flexible material is of the same general class as that provided by the supporting structure.

Figure 2:
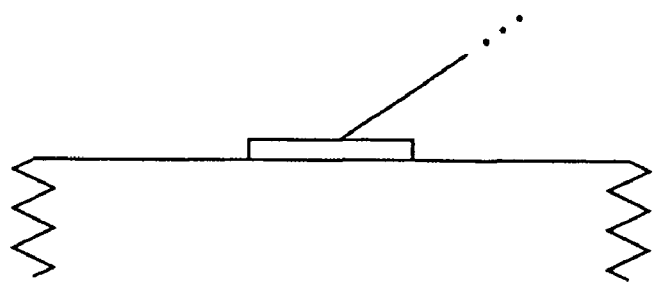
FIG. 2 illustrates a probe in contact with a device under test.
Figure 3:
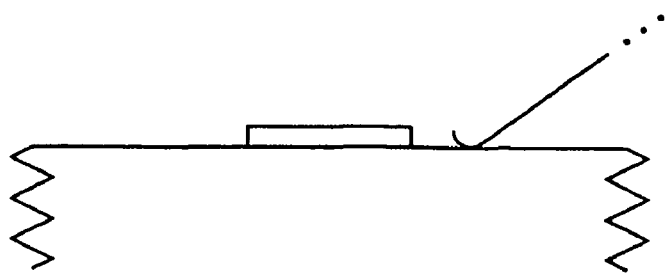
FIG. 3 illustrates a bent-tip probe in contact with a device under test.

As illustrated in FIG. 2, the elongate probing element is typically oriented at an acute angle with respect to the device under test so that the probing element has at least some limited compliance (i.e., bending) when probing the device under test. In addition, the probing element is also typically brought into contact with the device under test in a partially horizontal motion so that the end of the probing element scrubs the surface of the wafer and then impacting the side of the pad or otherwise scrubbing across a portion of the pad. In this manner, it is easier to make contact between a small probe tip and a small contact portion under conditions that include some vibrations. Unfortunately, a long elongate "needle-like" probing element tends to bend after repeated contacts resulting in a "curled" end portion, as illustrated in FIG. 3. After the end portion becomes sufficiently curled, the probe does not effectively stop when impacting the side of the pad, but rather tends to skate up onto the pad, slide across the pad, and off the pad. The inability to effectively stop when impacting the side of the pad makes probing difficult.

Figure 4:
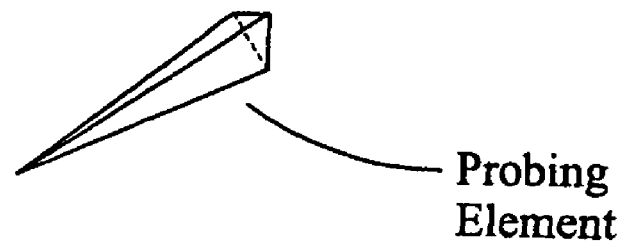
FIG. 4 illustrates a probing element.

The present inventors considered the existing probes that included an amplifier circuit interconnected to an elongate conductive probing element and determined that to impose a small capacitance, the traditional use of an elongate substantially cylindrical wire may be replaced by a more structurally suitable probe element having a different geometry. Referring to FIG. 4, the probe structure preferably has a generally tapering tip portion over at least 25% or more, 35% or more, 50% or more, 75% or more, and preferably 100% of the length of the probe element. The tapering preferably continually decreases in cross-sectional area along a majority, more preferably at least 75%, and more preferably at least 100% of the respective tapered portion.

Figure 5:
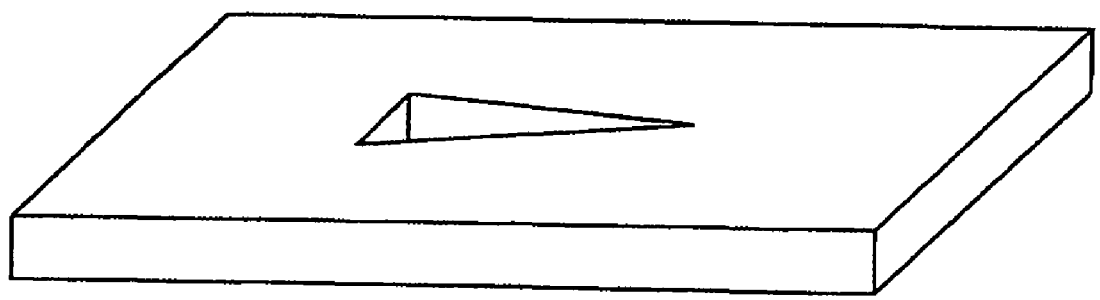
FIG. 5 illustrates a sacrificial substrate with a depression therein.

The probe element may be constructed using any suitable fabrication and/or machining process. However, to create a probe element that has uniform structure shape in a repeatable manner a sacrificial substrate is preferably used, as shown in FIG. 5. The sacrificial substrate is preferably copper or aluminum, although any suitable material may be used. A depression with a desirable shape may be created in the substrate using a dimpling tool (preferably made of material harder than the sacrificial substrate) or otherwise a mask together with a chemical etch. In some cases, the chemical etch will create a depression in the sacrificial substrate along the grain boundaries. After creating a suitable depression, a conductive material is formed in the depression, such as nickel, aluminum, rhodium, or other conductive material(s). If desired, a layer of rhodium may be deposited within the depression followed by other conductive material to fill the depression. It would be noted that rhodium has the characteristic that it does not tend to stick to material being probed and materials tend to slide on it rather than gall. The top of the sacrificial substrate is lapped to remove excessive conductive material and form a flat planar surface. A temporary material may be deposited or otherwise provided over the conductive material, if desired. The sacrificial substrate is then removed from the conductive material and temporary material (if included) using a chemical or other technique. The probing elements formed in this manner may be produced in an efficient manner using a plurality of depressions in the same sacrificial substrate. In addition, a variety of different shapes of depressions maybe included on a single sacrificial substrate to create different probe elements, each of which may have different electrical characteristics. Also, the probe elements formed in this manner tend to be substantially uniform.

After repeated use, the tip of the probe elements illustrated in FIG. 4 do not tend to bend with such associated limitations previously described, but rather the tip of the probe elements tends to break or otherwise fracture. After the tip portion of the probe element breaks, the resulting probe element is slightly shorter. However, a probe element with a portion broken away still tends to maintain a relatively sharp probing tip, and therefore maintains suitable structure for probing the device under test. It is also noted that the probe element does not bend, or incur any substantial flexing, under normal probing conditions unlike the substantial flexing that "needle-like" probes incur. Normal probing conditions may be defined as 10 grams of pressure or less, 5 grams of pressure or less, 2 grams of pressure or less, 0.5 grams of pressure or less, or otherwise, as desired.

Figure 6:
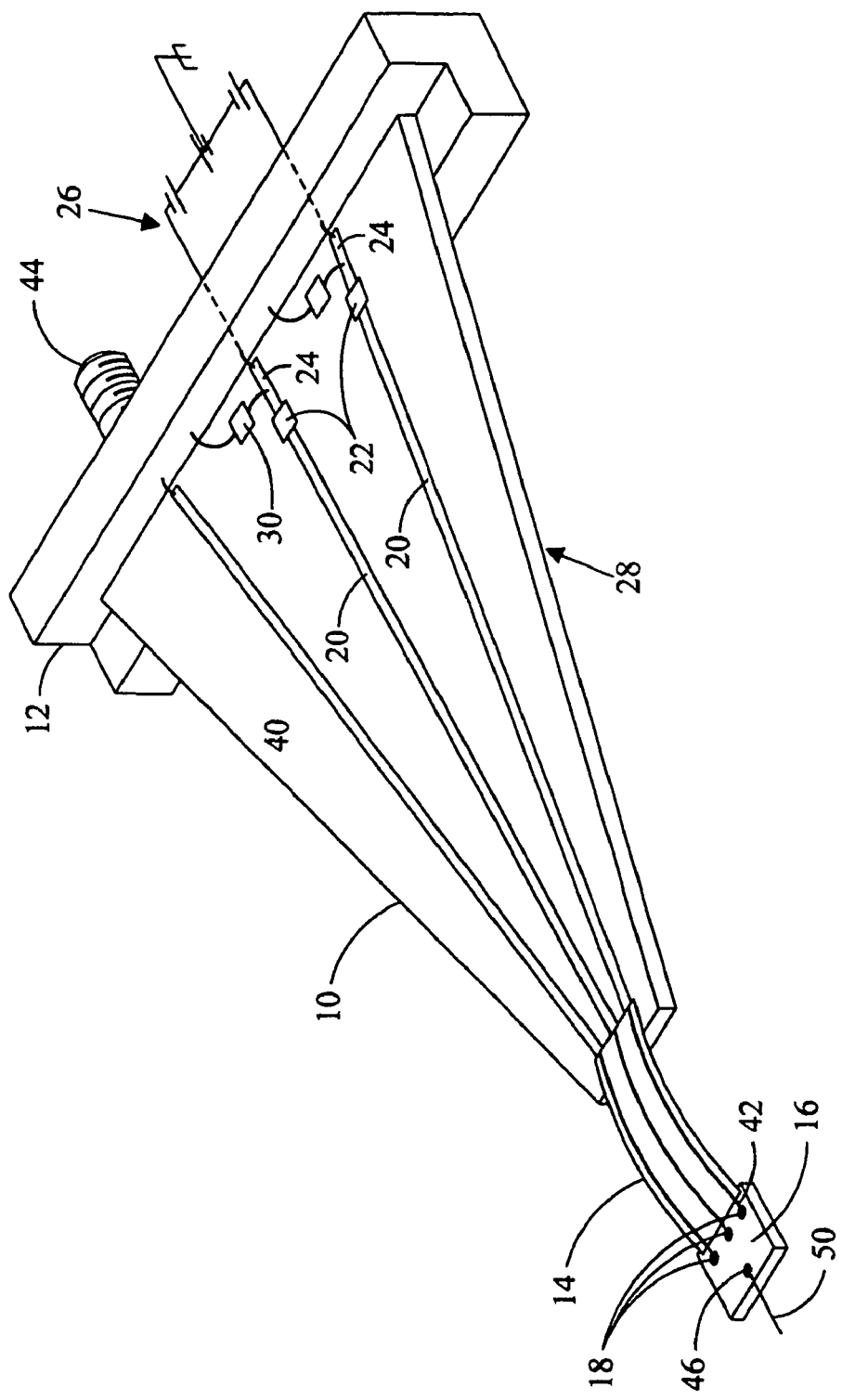
FIG. 6 illustrates another probe, an active circuit, a flexible interconnect, and a supporting structure.

A couple techniques to interconnect an active circuit with a flexible material to a substrate are illustrated, although other techniques may likewise be used, as desired. The wafer probe shown in FIG. 6 comprises a substrate support 10 of ceramic material. The substrate is generally triangular when viewed from above, and is attached at its base to a mounting block 12. At its apex, the substrate 10 carries a flexible material 14, and a monolithic integrated circuit amplifier 16. The amplifier may be a three stage source follower circuit implemented in gallium arsenide having an input impedance of about 100 megohms in parallel with about 10 fF. The amplifier has power supply terminals 18 that are connected through microstrip conductors 20 and 50 ohm resistors 22 to the terminals 24 of a D. C. voltage supply 26. The substrate 10 carries at its underside a continuous layer 28 of conductive material which is grounded by way of the block 12. The microstrip conductors 20 and the layer 28 constitute two power-supply transmission lines each having a characteristic impedance of 50 ohms. The transmission lines are terminated in their characteristic impedance by the resistors 22. By-pass capacitors 30 are connected between the terminals 24 and the mounting block 12. Therefore, perturbations in the power supply voltages are not transmitted to the amplifier.

A third microstrip conductor 40 is connected to the output terminal of the amplifier 16 by a wire 42 and extends between the amplifier 16 and the central conductor of a coaxial connector 44. The conductor 40 and the layer 28 together constitute a third transmission line. The coaxial connector is used for connecting the third transmission line to a measurement and display instrument, such as a sampling oscilloscope or network analyzer. The amplifier also has an input terminal 46, which is connected to a conductive probe element 50. The probe element 50 may comprise, for example, a wire or nonwire element that is attached to the input terminal of the amplifier 16.

In use, the illustrated probe is mounted by way of the mounting block in a probe station, and the probe is positioned so that the probe element 50 contacts a node of interest in a circuit under test. A ground connection and other power supply voltages are connected to the circuit under test by way of other probes of conventional design. Signals developed at the node of interest are applied to the input terminal of the amplifier 16 by way of the probe element 50 and are transmitted by way of the output terminal, the wire 42, traces on the flexible material, the transmission line 40 and the connector 44 to the measurement and display instrument (not shown). Through use of the amplifier 16, a high input impedance is presented to the node of interest, and accordingly the operation of the circuit under test is not perturbed significantly by the testing operation. The amplifier 16 preferably has a relatively low output impedance and accordingly is well matched to the transmission line 40.

As noted previously, the input impedance of the amplifier 16 is very high. This stems from the fact that the value of $G_m*Z_g$ for a field effect transistor implemented in gallium arsenide (where $G_m$ is the transconductance of the transistor and $Z_g$ is its gate impedance) is high. $G_m*Z_g$ is proportional to $F_t$, or the frequency for unity current gain, of the transistor.

Because the input impedance of the amplifier 16 is high, the inductance of the probe element 50 does not degrade significantly the input signal applied to the probe element. Nevertheless, in order to minimize reception of stray signals by virtue of the probe element 50 acting as an antenna, the length of the probe element should be kept to a minimum. It is therefore desirable that the probe element is relatively short. Consequently, the inductance and the capacitance of the probe element is small and does not contribute to signal degradation.

Because the amplifier 16 has a high input impedance, the conductor that connects the circuit under test to ground can have quite a high impedance and therefore can be quite long. This makes it possible for the ground connection to the circuit under test to be made by way of a separate probe, rather than by way of a second probe element carried by the substrate 10.

Figure 7:
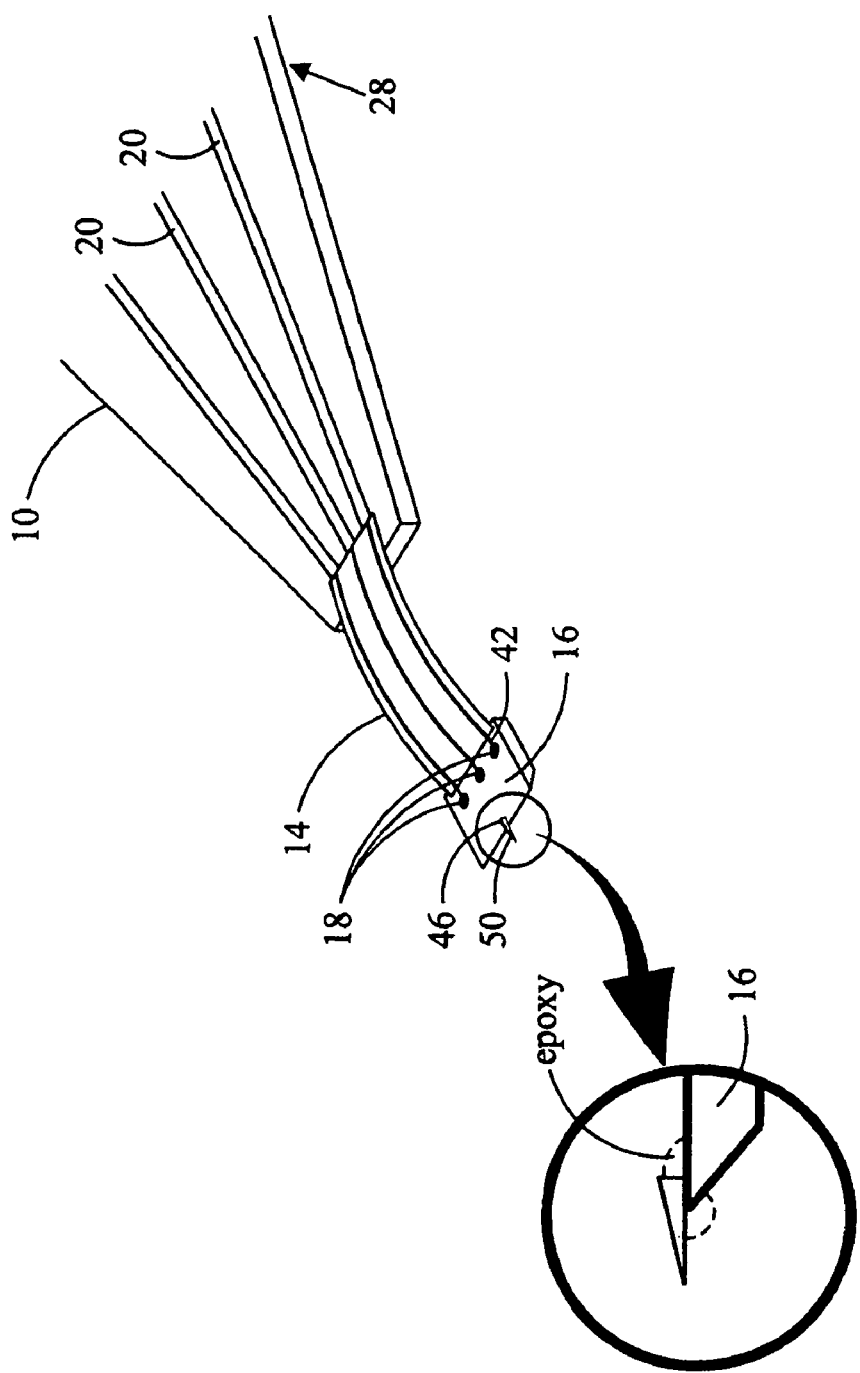
FIG. 7 illustrates yet another probe, an active circuit, a flexible interconnect, and a supporting structure.

Referring to FIG. 7, another probe structure is illustrated. The probing element of FIG. 4 is supported by the active circuit. The active circuit is interconnected to the substrate, which typically has a dielectric constant of about 10, by the flexible interconnection. The active circuit is preferably fabricated in a silicon or gallium arsenide material. The material preferably has a tapered edge under the connection with the probing element. In this manner the tapered edges reduces the capacitance by further limiting the amount of material under the probing element. The probing element may be secured by epoxy, which typically has a dielectric constant between 4 and 5.

It will be appreciated that the present invention is not restricted to the particular probe head that has been described and illustrated, and that variations may be made therein. For example, instead of microstrip transmission lines, with the signal and ground conductors on opposite sides of the substrate 10, coplanar transmission lines may be used. Alternatively, a microstrip transmission line may be used for connecting the output terminal of the amplifier to the measurement instrument. In this case, the amplifier 16 would be mounted near the end of the microstrip transmission line and wires would be used to connect the amplifier to the bias supply 26. The by-pass capacitors 30 would be mounted near the amplifier. It is not essential to the invention that a monolithic integrated circuit be used for the amplifier 16, since a hybrid circuit may be used instead. For example, a split band amplifier may be used. Also, the active circuit may be interconnected to a co-axial cable to which the probing element is supported.

Figure 8:
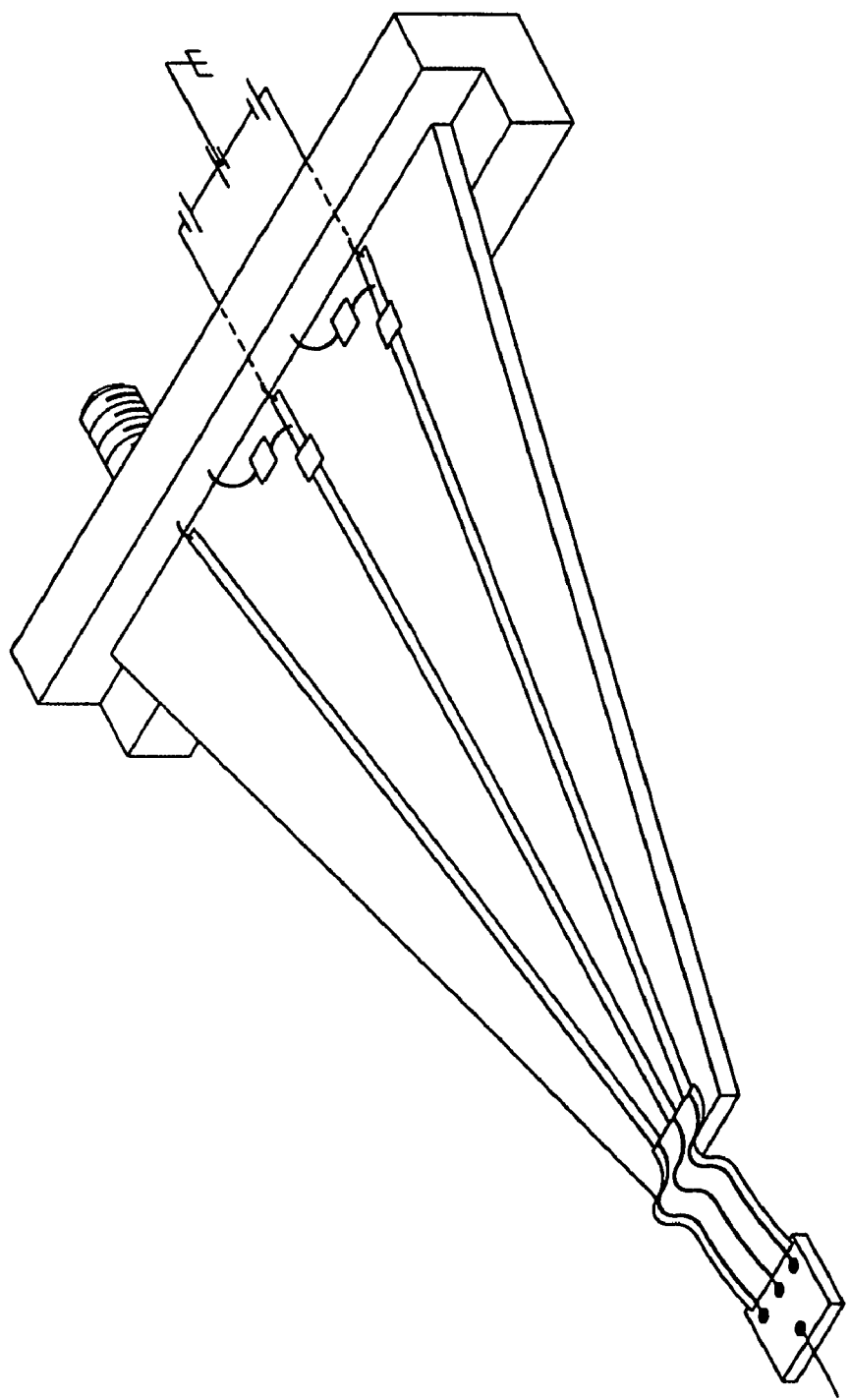
FIG. 8 illustrates yet another probe, an active circuit, a flexible interconnect with a bend therein, and a supporting structure.

The probe disclosed above has sufficient vertical compliance when probing a pad. In many cases the probe is placed in pressing contact with the edge of the device under test, and vibration of the device under test and/or the probing element results in significant horizontal motion. The flexible interconnection having a rectangular shape tends to result in limited horizontal compliance. In addition, when attempting to make sufficient pressing contact with the edge of the device under test, especially with vibrational movement, the force imposed on the probing element is significant. In order to increase the lateral compliance and decrease the pressure exerted on the probing element when coming into pressing contact with the edge of a device under test, the flexible material includes a bend therein, as illustrated in FIG. 8. Other configurations and structures of the flexible material may be used to provide an increased (or 1.5× or more, 2× or more, 4× or more, 6× or more, 8× or more, or 10× or more) lateral compliance and/or decrease in pressure exerted than would have occurred if the material was simply flat rectangular.

Another configuration that may be implemented is replacing the active circuit with a primarily resistive element fabricated on the semiconductor material (e.g., gallium arsenide, silicon). The resistive material has a resistance significantly greater than a traditional 50 ohm resistive probing element, such as for example, 500 ohms, 1,000 ohms, 2,500 ohms, and 5,000 ohms. The significant resistance lowers the current drawn from the device under test. The resistive material also presents a low capacitance to the device under test, such as for example, less than 25 fF, less than 15 fF, les than 10 fF, and less than 5 fF. The relatively low capacitance reduces the loading on the device under test. In some implementations, the resistive element may be supported by a substrate and be relatively small in value, such as for example, less than 10,000 ohms, less than 5,000 ohms, less than 2,500 ohms, and less than 1,000 ohms, while preferably being greater than 100 ohms, 250 ohms, and 500 ohms. As it may be observed, using a resistive element has many advantages, such as one or more of the following, passes high frequencies, has limited loading on the device under test; does not need a bias circuit, has no voltage offsets, and is limited by the power carrying capacity of the resistive element.

It is also noted that using a passive element, such as a resistor, also tends to reduce issues surrounding electrostatic discharge, linearity of the response, increases usable bandwidth, increases the useful voltage range, and is more readily fabricated.

Figure 9:
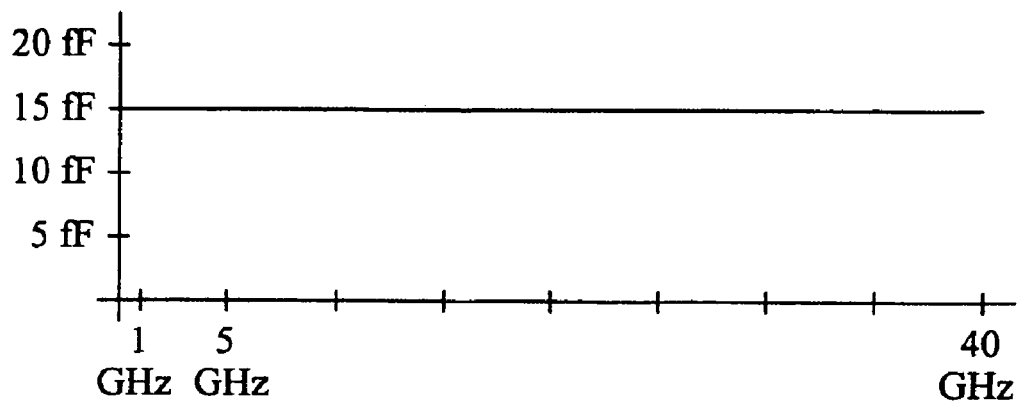
FIG. 9 illustrates a frequency response.

Referring to FIG. 9, the performance characteristics of the active based (and resistive based) probing element has a capacitance that is preferably less than 20 fF, more preferably less than 15 fF, more preferably less than 10 fF between 5 GHz and 20 GHz, and more preferably between 1 GHz and 40 GHZ, and more preferably between 0 Hertz and 40 GHz.

It has been observed that at relatively high frequencies, such as 40 GHz or above, that the loading of a 20:1 probe (950 ohm tip resistor) tends to be dominated by the capacitance of the tip structure, which may be for example 10 fF (1/2PI/10 fF/40 GHz=400 ohms). This impedance tends to have a somewhat predictable effect on the edge rise times. However, the direct current loading of an internal node of a device under test tends to offset the bias point, and in some circuits with a high internal direct current source impedance may corrupt the circuit behavior despite the ability of the local devices to drive the load with transient voltages.

Figure 10:
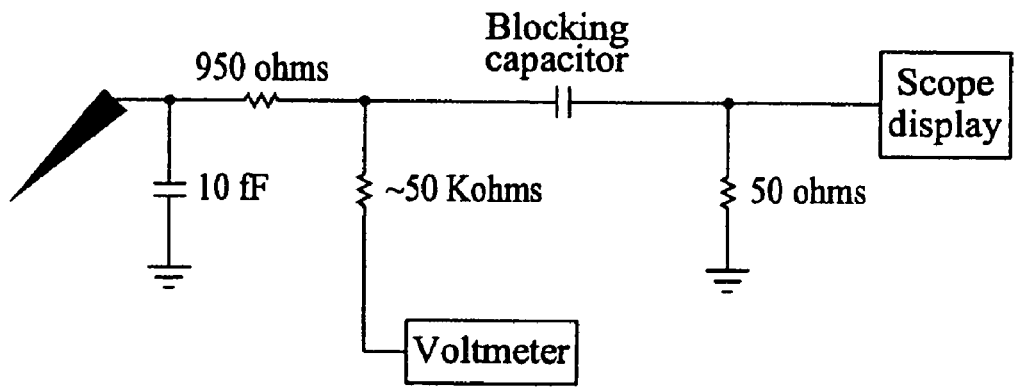
FIG. 10 illustrates a schematic and signal path on a probe for a passive type probe.
Figure 10:
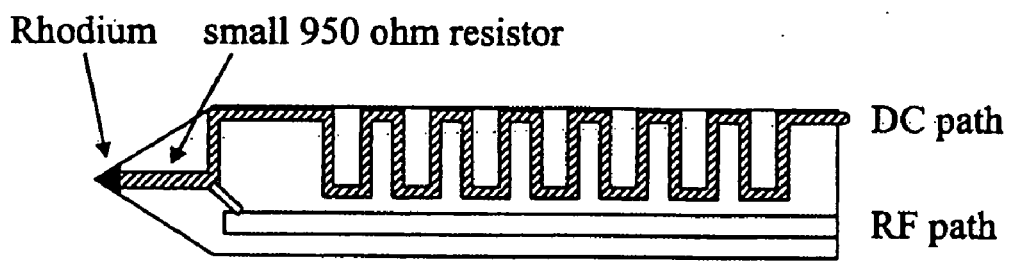

Referring to FIG. 10, to mitigate this loading effect, or otherwise substantially eliminate this loading effect, a direct current "block" may be introduced, such as on the probe chip (support) or as an element of the coaxial component. However, the ability to measure the direct current levels present in the device under test will be impaired. The ability to measure direct current levels may be maintained by tapping into the signal at the tip with a sense resistor of relatively high resistance, such as for example, 0.05 M ohm to 10 M ohm or more, interconnected by a separate path to a high impedance (e.g., large sense resistor) voltage sensing device. The voltage sensed normally would read the average voltage, which may then be calibrated to the scope's apparent zero voltage level.

In some cases it has been determined that under some probing conditions, such as for probing printed circuit boards, it is desirable to include a probing element that has definable geometry other than a "wire", such as the probing elements described herein. The probing element is typically supported by a supporting structure, such as a coupon, which is in turn interconnected to a transmission structure, such as a coaxial cable. A flexible structure may be included between the coupon and the transmission structure, if included.

Figure 11:
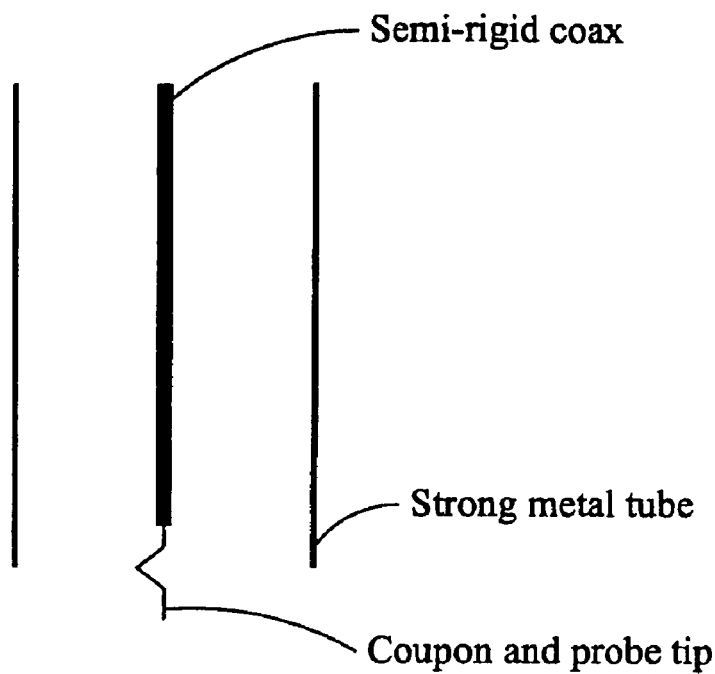
FIG. 11 illustrates a probe a structural element.

In some cases, the user of the probe may exert excessive pressure on the device under test which likewise typically results in excessive bending of the probe. While excessive pressure may damage the device under test, it is also likely to damage the probe itself thereby rending it inoperative. Referring to FIG. 11, the probe may include a structural element, such as a rigid tube, that acts to inhibit further bending of the probe upon testing a device under test. In this manner, the probe may bend a through a limited range of motion, without the potential of excessive bending. For example, the probe may be permitted to bend through a range of 10%, 20%, 30%, 45% or less with respect to the end of the probe and the length of the transmission structure, such as the coaxial cable. Normally, the reach of the probe tip is less than the structural element so that upon maximum bending the probe tip is protected against being drug sideways and crushed by the structural element.

Figure 12:
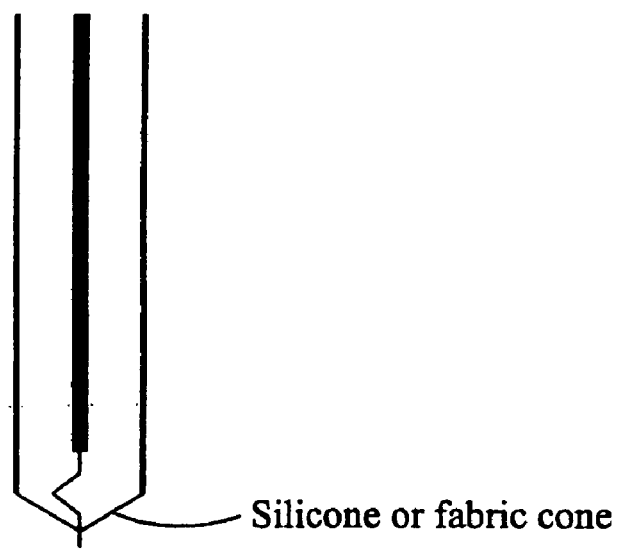
FIG. 12 illustrates a probe with a flexible element.

Referring to FIG. 12, in some cases the structural element will result in decreased visibility of the probe tip and the device under test, normally being viewed using a microscope. A modified structure may include a structural element that includes a material, such as silicone or fabric cone, which folds inward with lateral displacement which permits a pointier probe.

Figure 13:
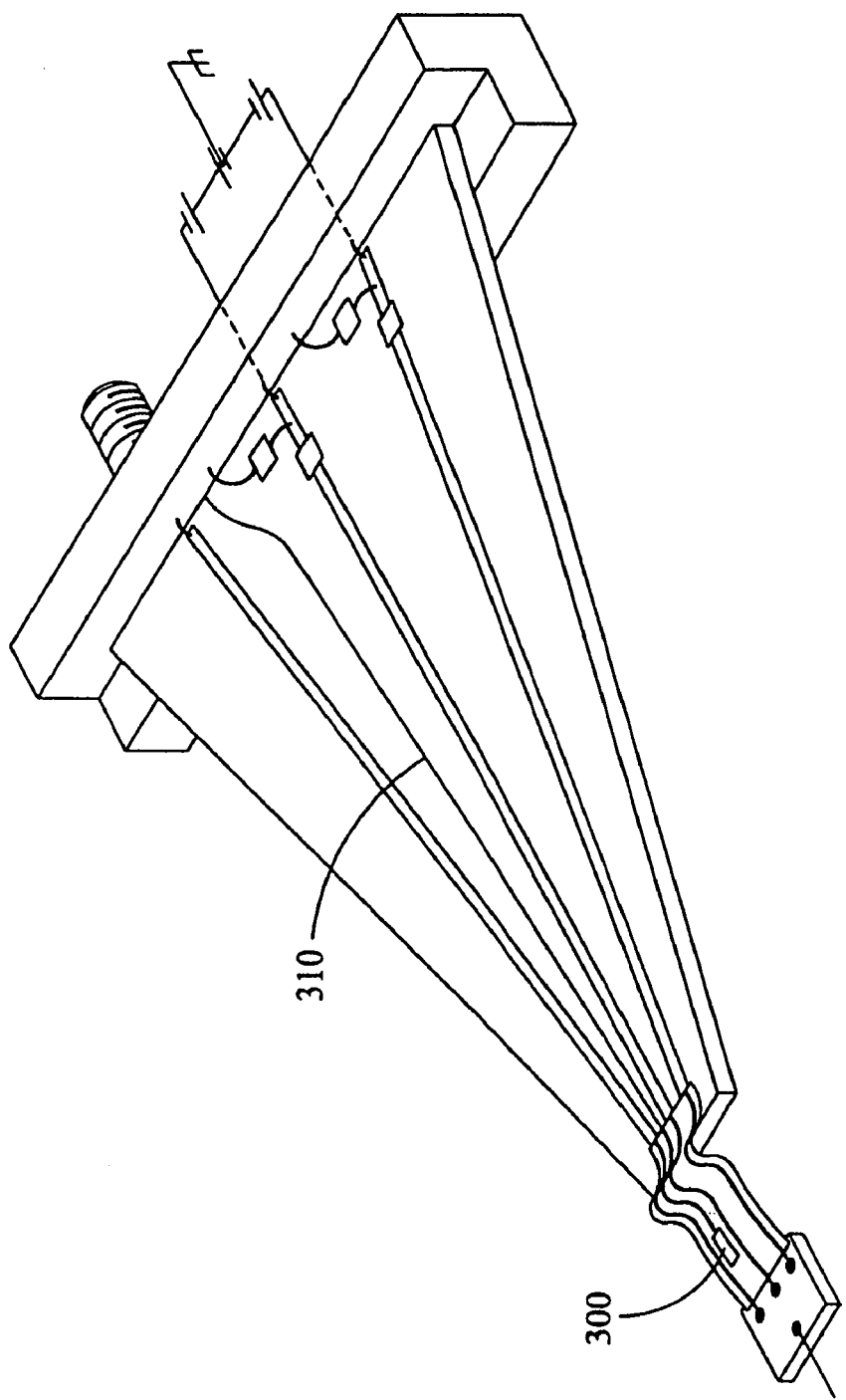
FIG. 13 illustrates a probe with a strain gage.
Figure 14:
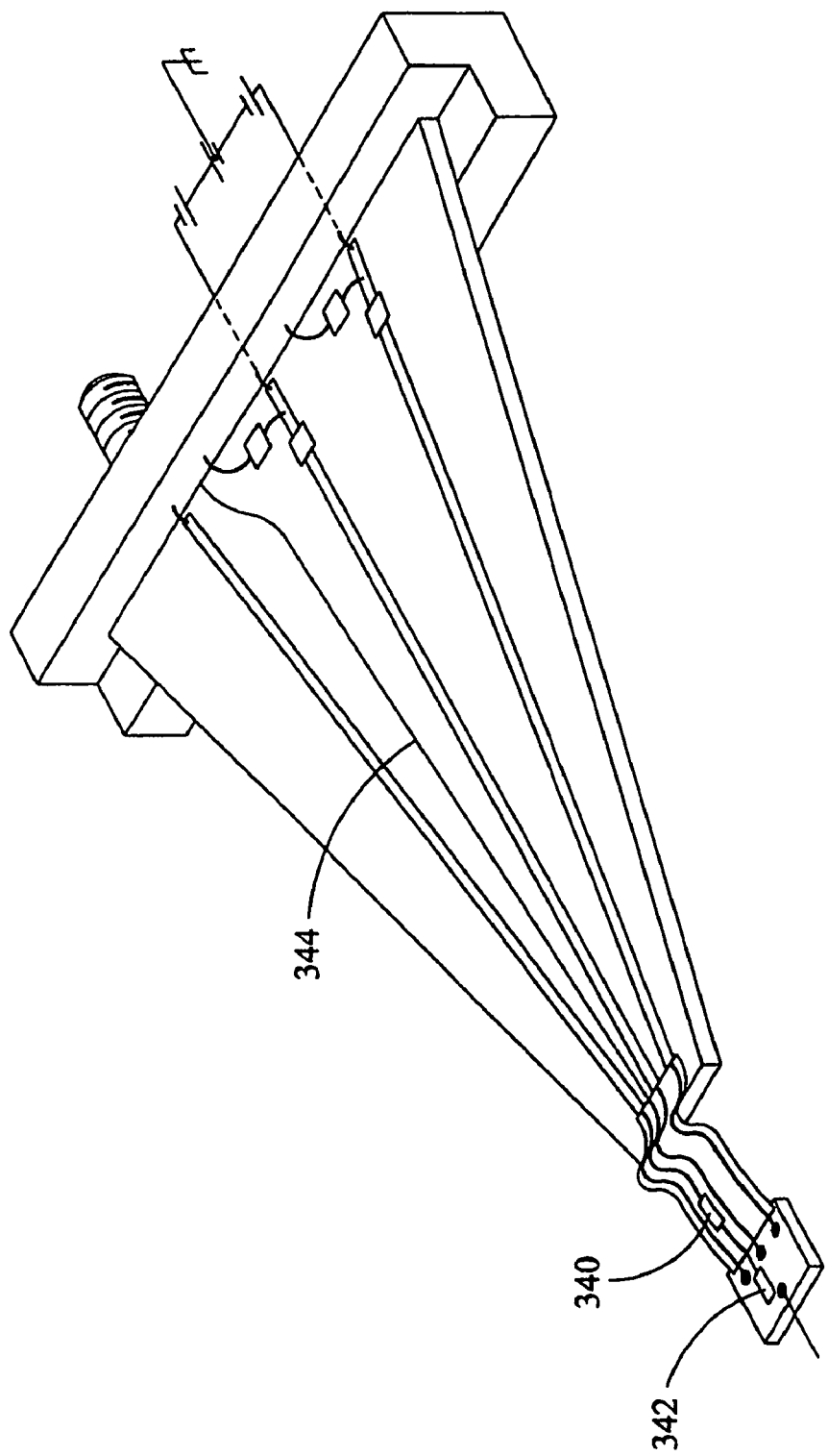
FIG. 14 illustrates a probe with a vibration sensor.
Figure 15:
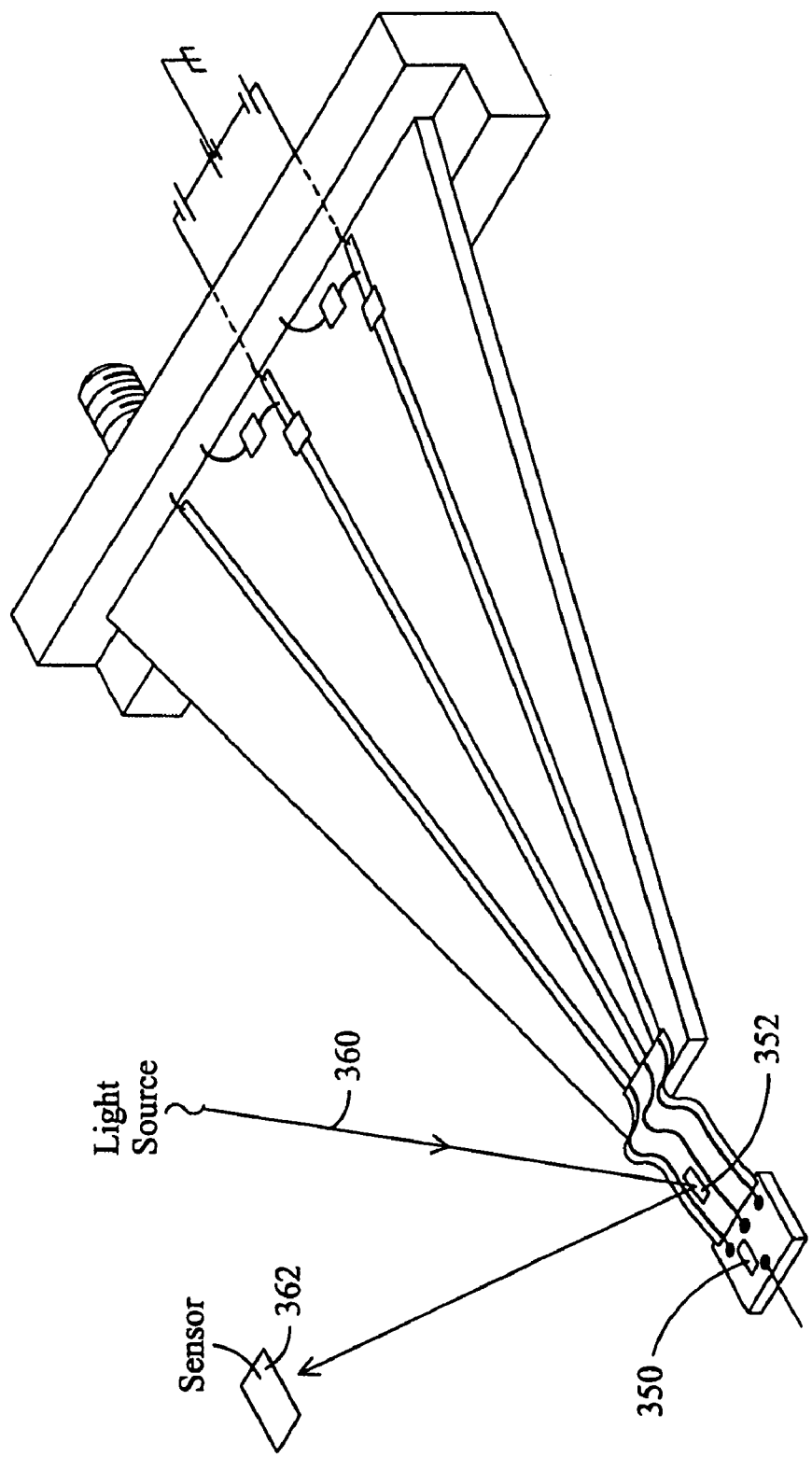
FIG. 15 illustrates a probe with a reflective element.

In some embodiments it is desirable to be able to sense the movements of a portion of the flexing of the tip portion or otherwise the flexing of a portion of the probe, as a result of the probe tip coming into contact with the device under test. Referring to FIG. 13, the flexible interconnection may include a strain gage 300 supported thereon. The strain gage 300 provides an indication to the system through a wire 310 of the deflection of the flexible material. Referring to FIG. 14, the flexible interconnection may include a vibration sensor 340 (frequency and/or amplitude) and/or the active circuit includes a vibration sensor 342 (frequency and/or amplitude). The vibration sensors 340 and 342 provide an indication to the system through a wire 344 of the contact of the probe with the device under test. For example, the vibration sensor may include a 30 kHz piezoelectric oscillator. Referring to FIG. 15, the active circuit or flexible interconnection may include reflective material 350 and 352, respectively. Light 360, such as laser light, may be reflected off the reflective material 350 and/or 352. A sensor 362 senses the light reflected from the reflective material 350 and/or 352. Based upon the location that the light is reflected, which relates to the angle of deflection, the system may infer some information regarding the probe contacting the device under test and the strain imposed on the probe and/or device under test.

In this manner, some indication is available of when the probe makes contact with the device under test. In addition, some indication is available of the pressure exerted by the probe with the device under test. In some cases, the operator may exert excessive force by the probe on the device under test, thereby causing damage to the probe or the device under test. In order to alleviate this concern, an indication may be provided to the operator of the device pressure level so that excessive pressure is not exerted by the probe. Further, the system may include automatic controls to inhibit the ability of the probe to exceed some threshold, and thus reduce the likelihood of damage to the probe or the device under test.

Figure 16:
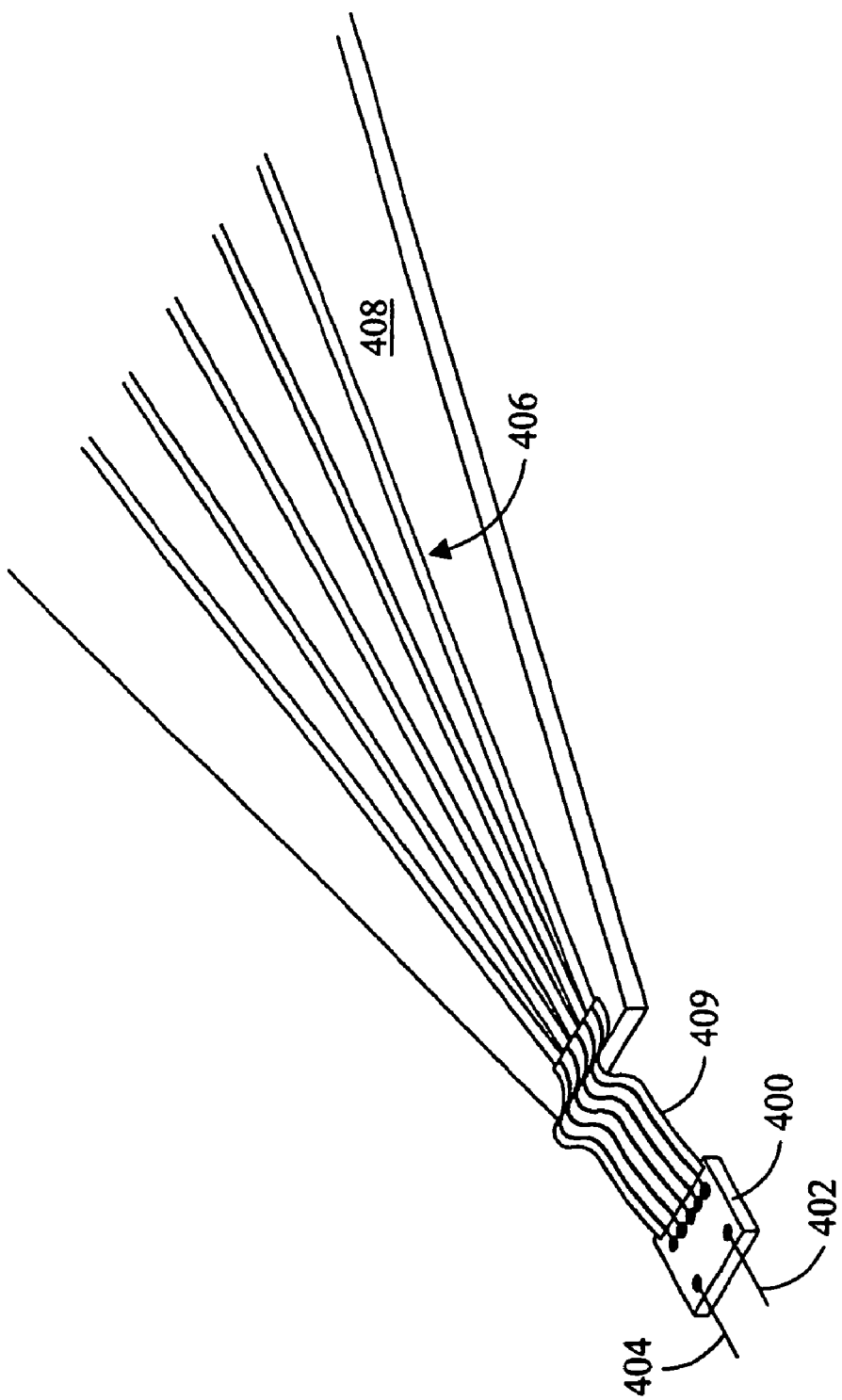
FIG. 16 illustrates a differential probe.

Referring to FIG. 16, it is desirable in some embodiments to permit differential probing of multiple devices under test (or a single device with two channels, if desired) by using a plurality of probing elements. For example, the active circuit 400 may include a pair of active elements (or resistive elements) thereon. Each of the elongate probing elements 402, 404 may be interconnected to respective active elements which are interconnected to a respective set of signal paths 406. The active elements are interconnected to the substrate 408 by a flexible interconnection 409. Each signal path may be a single line, or more preferably a ground-signal-ground path which provides improved signal integrity.

Figure 17:
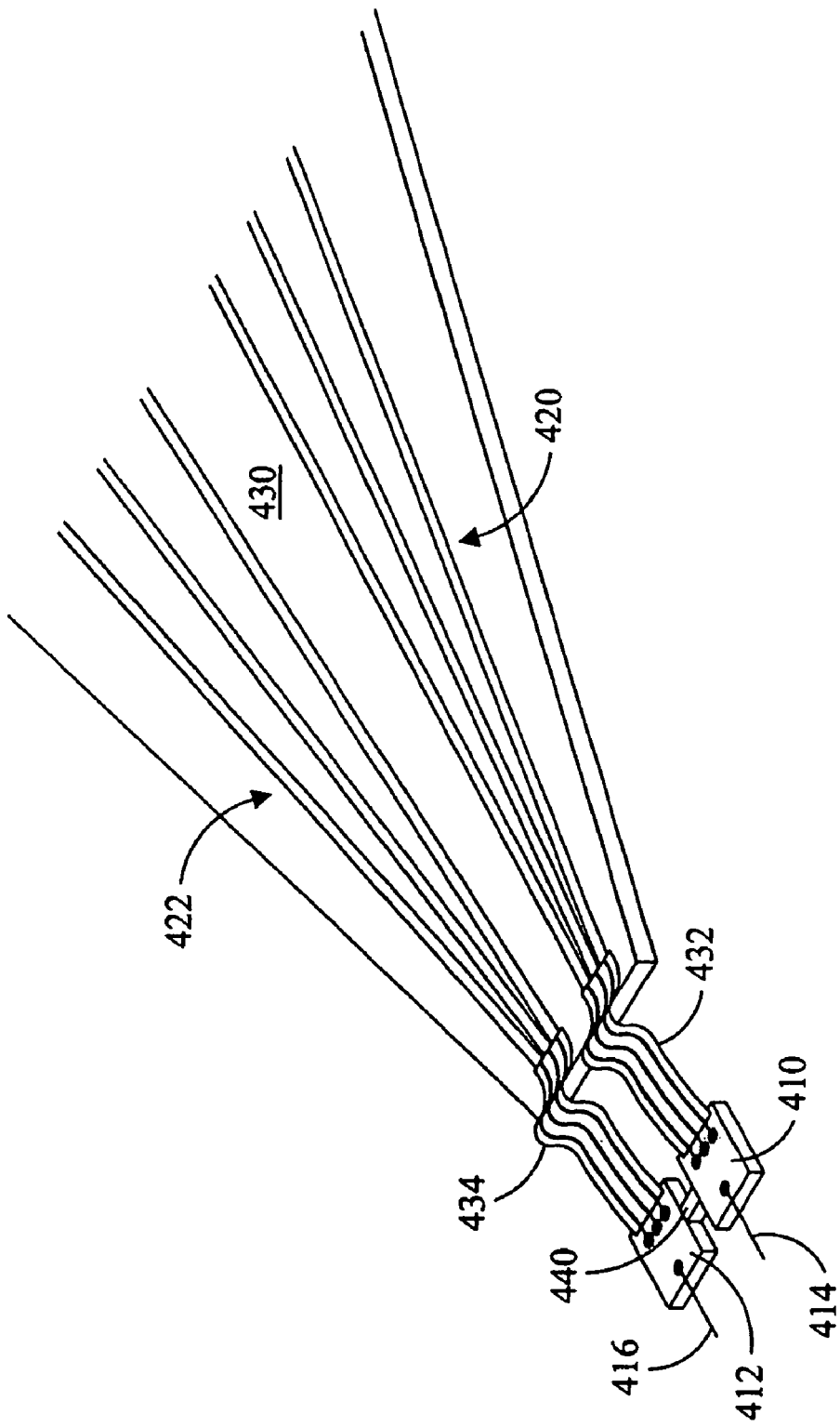
FIG. 17 illustrates another differential probe.

Referring to FIG. 17, it is desirable in some embodiments for differential probing to include a plurality of active circuits (or resistive elements) 410 and 412 each of which is supported by a substrate. An elongate probing element 414 and 416, respectively, is interconnected to the respective active circuit 410 and 412. The active circuits 410 and 412 are interconnected to the substrate 430 by a respective pair of flexible interconnects 432 and 434. The active circuits 410 and 412 are interconnected to a respective set of signal paths 420 and 422. The substrates for the two active circuits may be interconnected by a member 440, which is preferably not rigid (albeit it could be) to provide some increased rigidity to the probe and assist in maintaining a suitable alignment of the probe contacts.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A probe for testing a device under test comprising:
   (a) an elongate tapered probing element;
   (b) an active circuit having an input with a first impedance, of more than 1,000 ohms and less than 1,000 fF, electrically interconnected to said probing element and a second input;
   (c) a flexible structure interconnecting said active circuit and a supporting structure such that when said probing element comes into contact with said device under test said flexible structure flexes and said active circuit moves relative to said supporting structure before said probing element is substantially deflected;
   (d) a transmission structure electrically interconnected to said second input.

2. The probe of claim 1 wherein said first impedance has a resistance greater than 500 K Ohms.

3. The probe of claim 1 wherein said first impedance has a resistance greater than 1,000 K Ohms.

4. The probe of claim 1 wherein said first impedance has a capacitance less than 25 fF.

5. The probe of claim 1 wherein said supporting structure includes said transmission structure and said flexible structure includes the same class of transmission structure.

* * * * *